(12) United States Patent
Terasawa

(10) Patent No.: US 6,180,965 B1
(45) Date of Patent: Jan. 30, 2001

(54) SEMICONDUCTOR DEVICE HAVING A STATIC INDUCTION IN A RECESSED PORTION

(75) Inventor: Yoshio Terasawa, Hitachinaka (JP)

(73) Assignee: NGK Insulators, Ltd. (JP)

(*) Notice: Under 35 U.S.C. 154(b), the term of this patent shall be extended for 0 days.

(21) Appl. No.: 09/068,749
(22) PCT Filed: Sep. 17, 1997
(86) PCT No.: PCT/JP97/03276
§ 371 Date: Jul. 2, 1998
§ 102(e) Date: Jul. 2, 1998
(87) PCT Pub. No.: WO98/12755
PCT Pub. Date: Mar. 26, 1998

(30) Foreign Application Priority Data

Sep. 17, 1996 (JP) ................................................. 8-244873

(51) Int. Cl.⁷ ............................. H01L 29/70; H01L 29/74
(52) U.S. Cl. .................. 257/144; 257/144; 257/152; 257/501; 257/506; 257/635; 257/510
(58) Field of Search ............................ 257/501, 506, 257/510, 519, 520, 548, 550, 635, 638, 917, 920, 146, 141, 152, 153

(56) References Cited

U.S. PATENT DOCUMENTS

| | | | |
|---|---|---|---|
| 4,786,614 | * 11/1988 | Cogan | 437/64 |
| 5,202,573 | * 4/1993 | Shirai | 257/144 |
| 5,323,028 | * 6/1994 | Nishizawa et al. | 257/136 |
| 5,459,346 | * 10/1995 | Asakawa et al. | 257/347 |
| 5,475,242 | * 12/1995 | Nishizawa et al. | 257/136 |
| 5,512,774 | * 4/1996 | Nakagawa et al. | 257/501 |
| 5,854,503 | * 12/1998 | Hsueh et al. | 257/347 |

FOREIGN PATENT DOCUMENTS

| | | | |
|---|---|---|---|
| 55-63166 | 4/1980 | (JP) | H01L/29/74 |
| 1-138763 | 5/1989 | (JP) | H01L/29/74 |
| 7-235662 | 9/1995 | (JP) | H01L/29/74 |

* cited by examiner

Primary Examiner—Donald L. Monin, Jr.
Assistant Examiner—Dwayne L. Bentley
(74) Attorney, Agent, or Firm—Parkhurst & Wendel, L.L.P.

(57) ABSTRACT

In a static induction semiconductor device, particular a high power static induction semiconductor device, recessed portions 12 are formed in one surface of a silicon substrate 11 of one conductivity type, gate regions 13 of the other conductivity type are formed at bottoms of the recessed portions, recessed portions 14 are formed at portions surrounded by adjacent gate regions, cathode short-circuit regions 15 of the other conductivity type are formed as an island at bottoms of the recessed portions to be extended to the surface of the silicon substrate. Cathode regions 17 extending up to the surface of the silicon substrate in succession to channel regions 16 surrounded by the cathode regions 13 and cathode short-circuit regions 15, are formed. A cathode electrode substrate 21 is formed to be contacted with the cathode short-circuit regions 15 and cathode regions 17. Carriers remaining within the channel regions at a turn-off are directly swept out into the cathode electrode substrate 21 through the cathode short-circuit regions 15, and thus it is possible to provide a static induction semiconductor device, in which a large current can be cut off at a high speed without increasing an on-resistance.

17 Claims, 25 Drawing Sheets

FIG._1

FIG_3

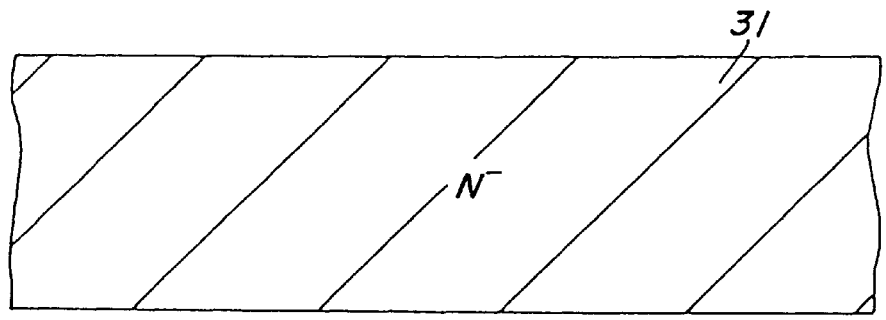
FIG_5
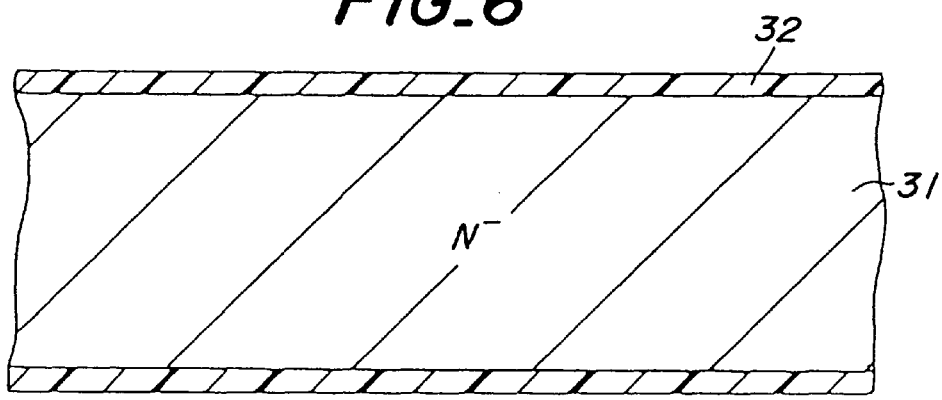
FIG_6
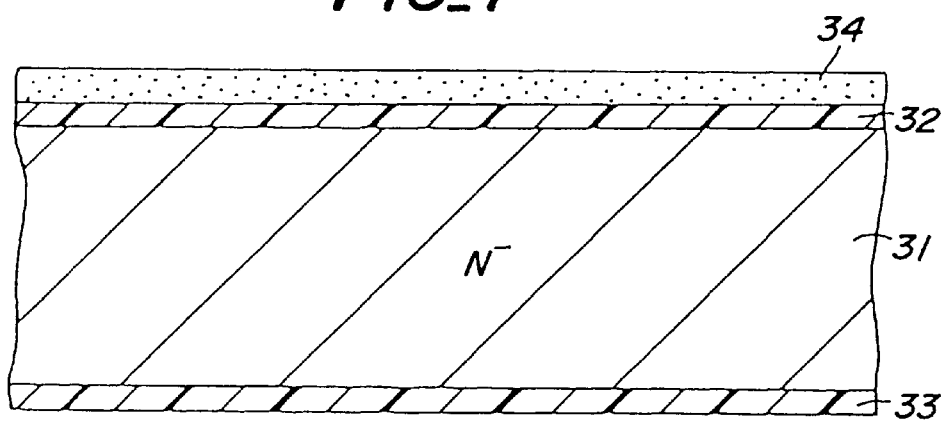
FIG_7

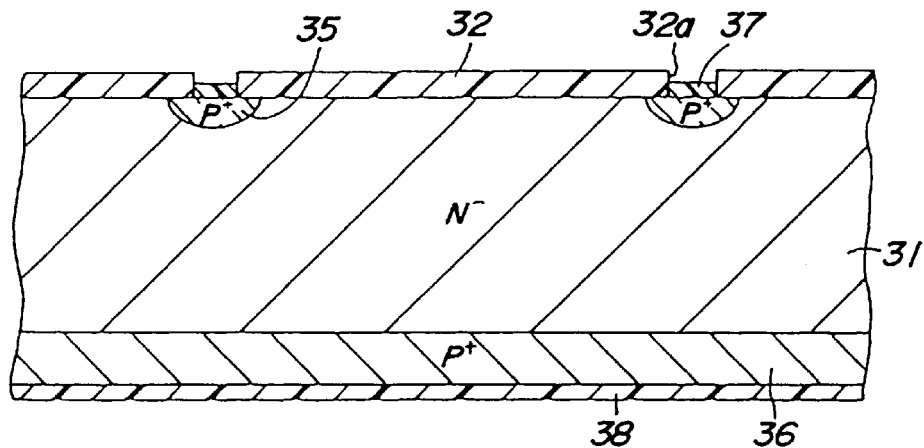
FIG_11
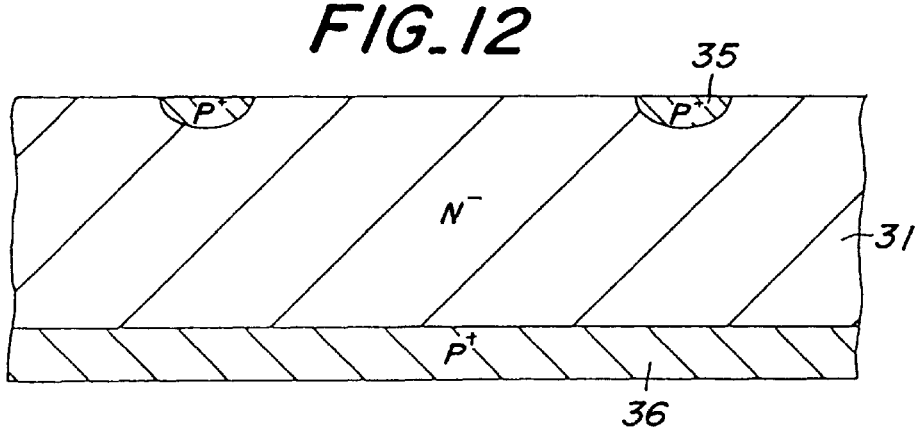
FIG_12
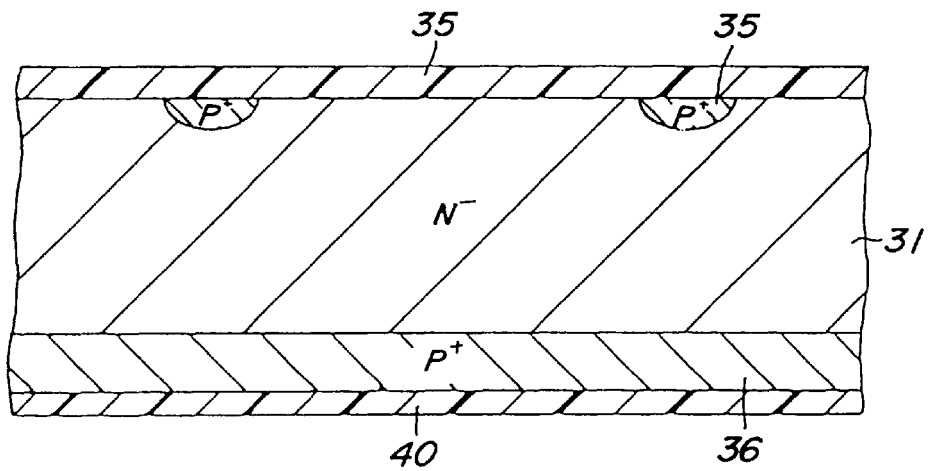
FIG_13

FIG_14
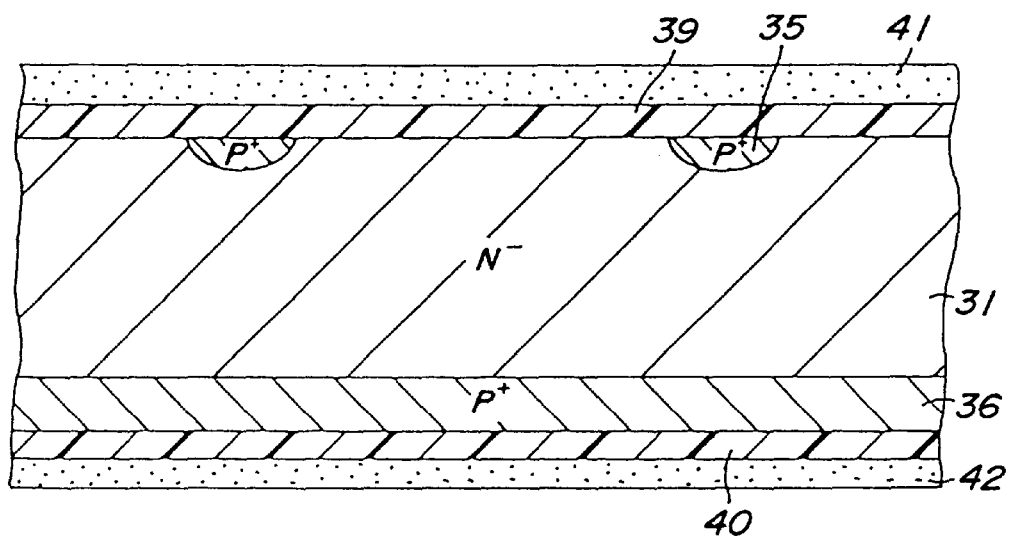
FIG_15
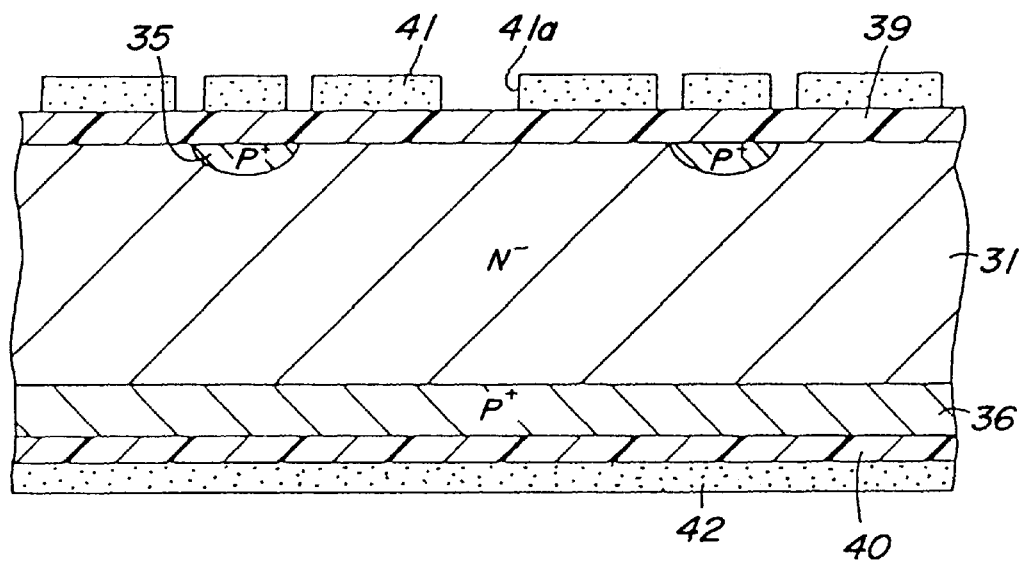

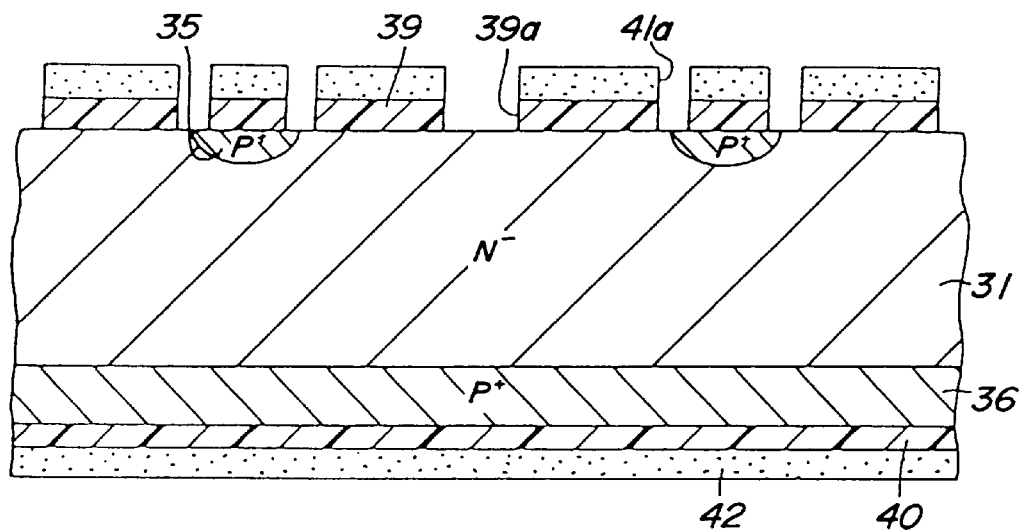
FIG_16
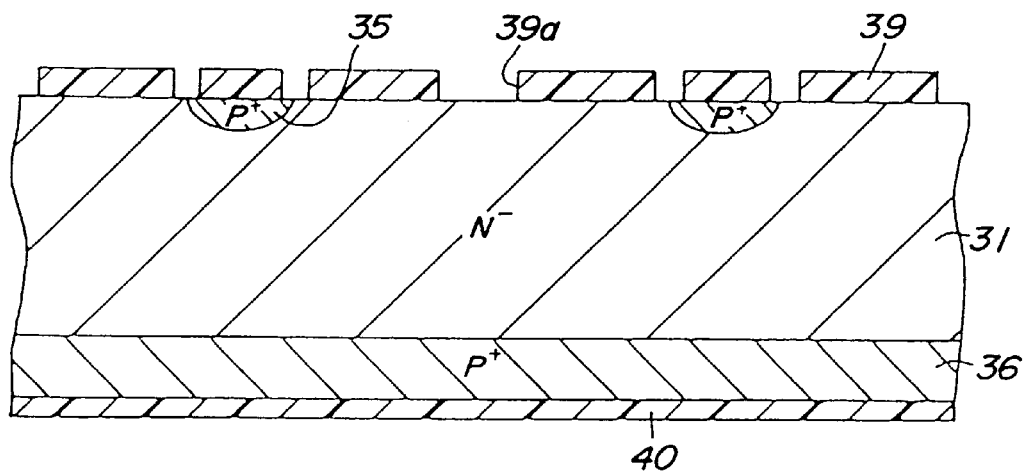
FIG_17

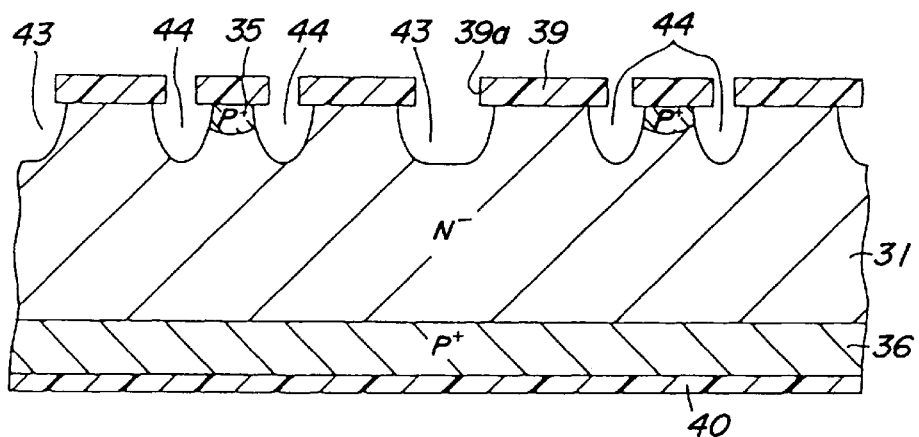
FIG_18
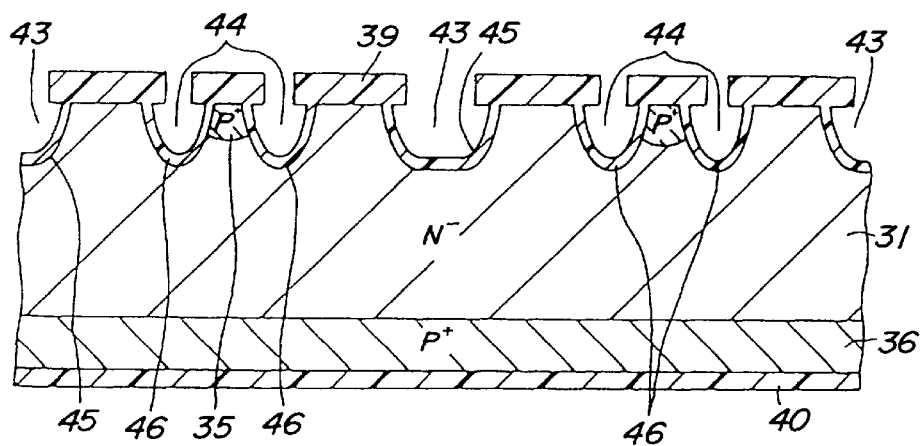
FIG_19
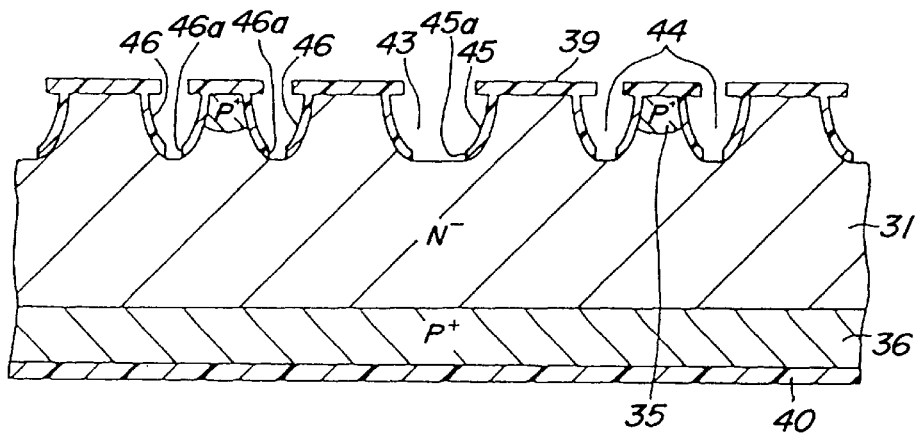
FIG_20

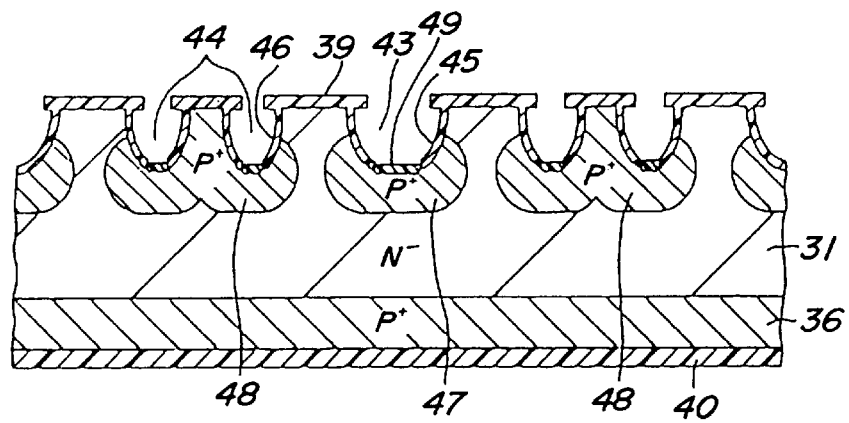
FIG_21
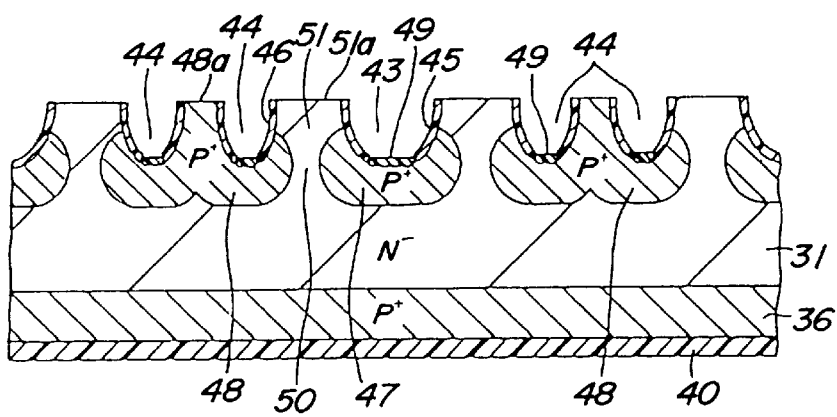
FIG_22
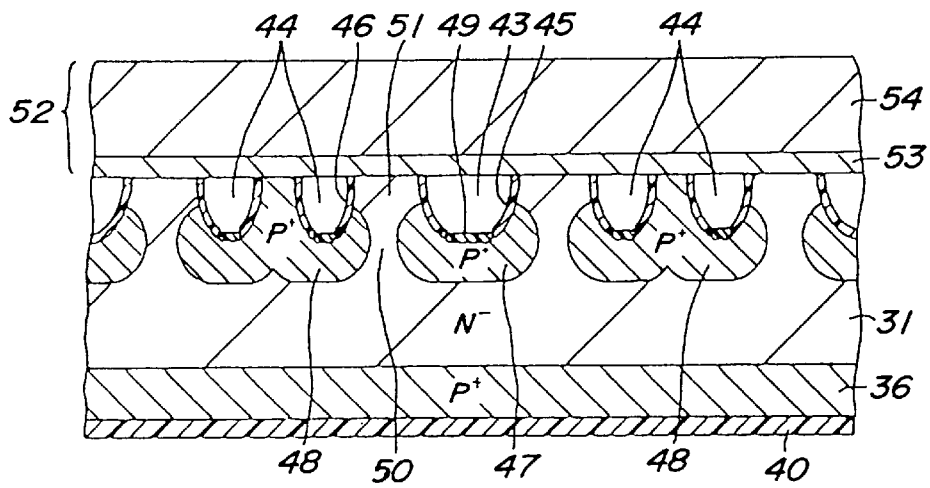
FIG_23

FIG._26

FIG. 29
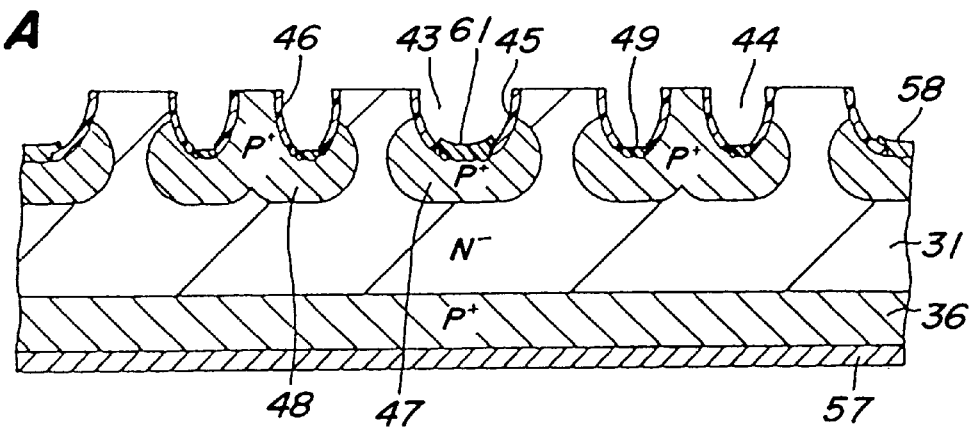
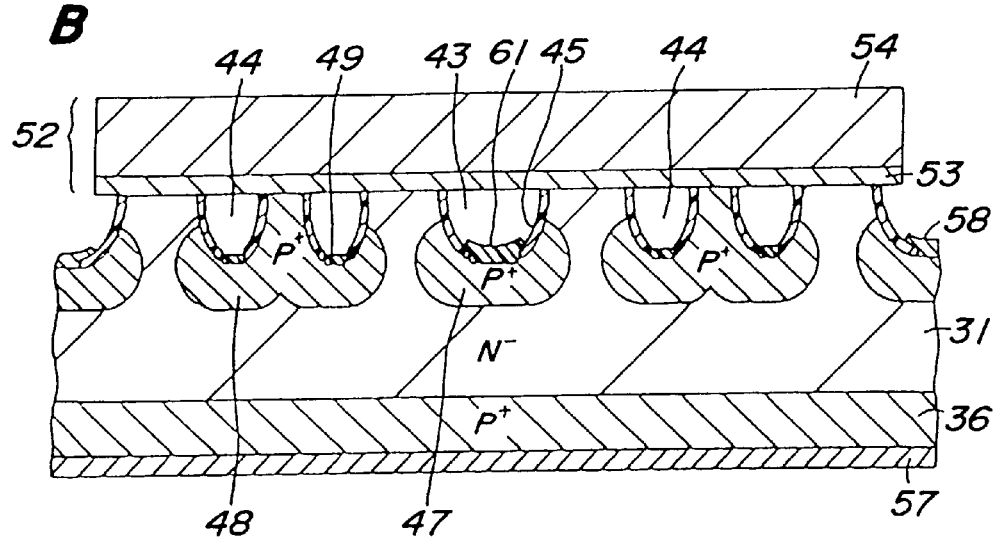

FIG.30
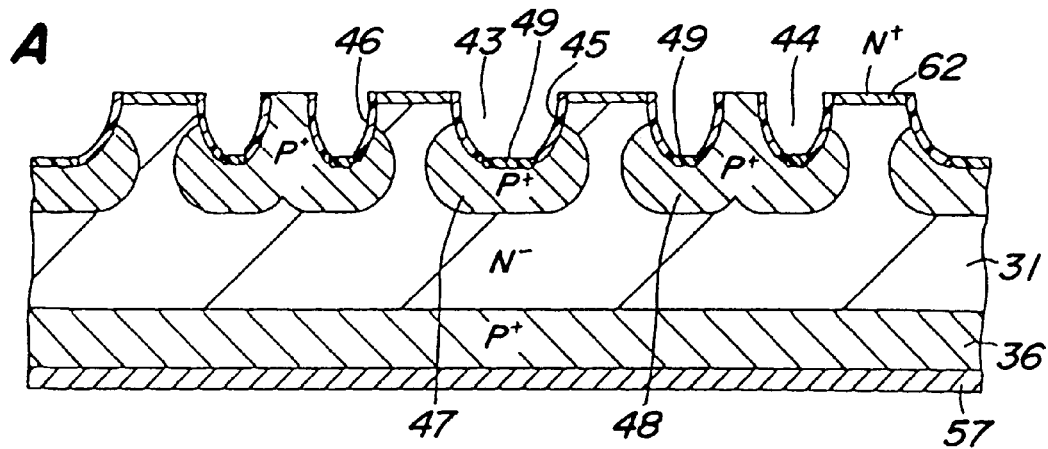
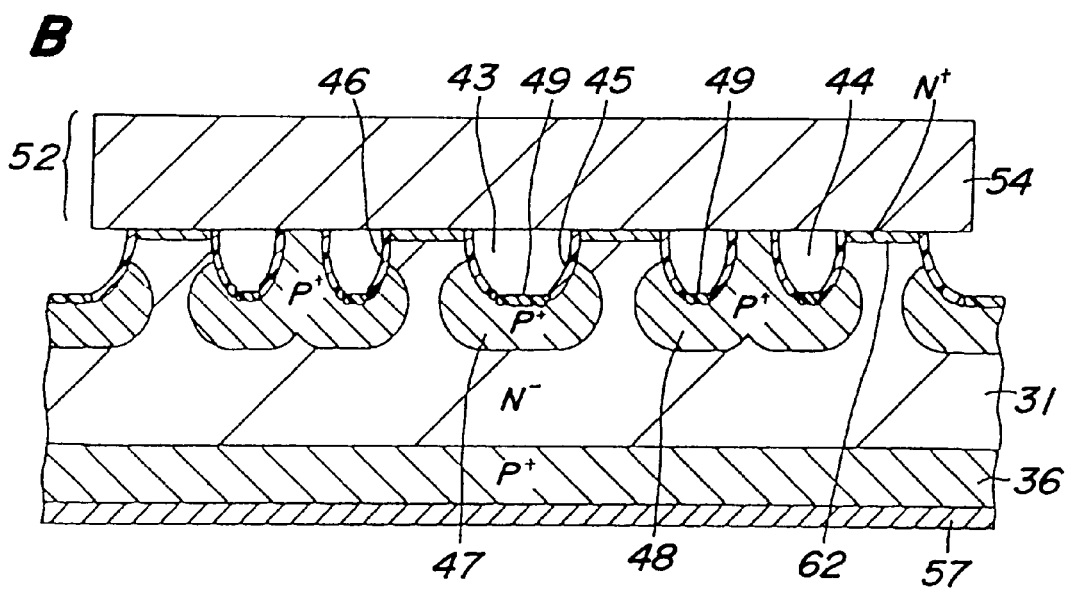

FIG_31
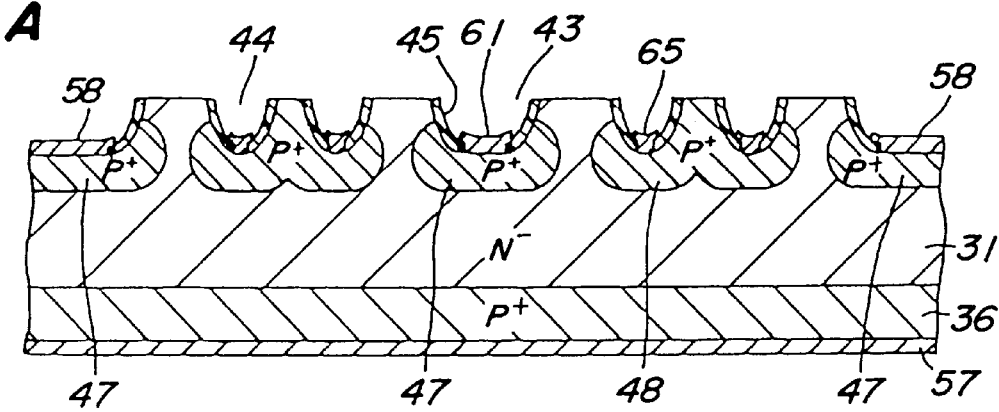
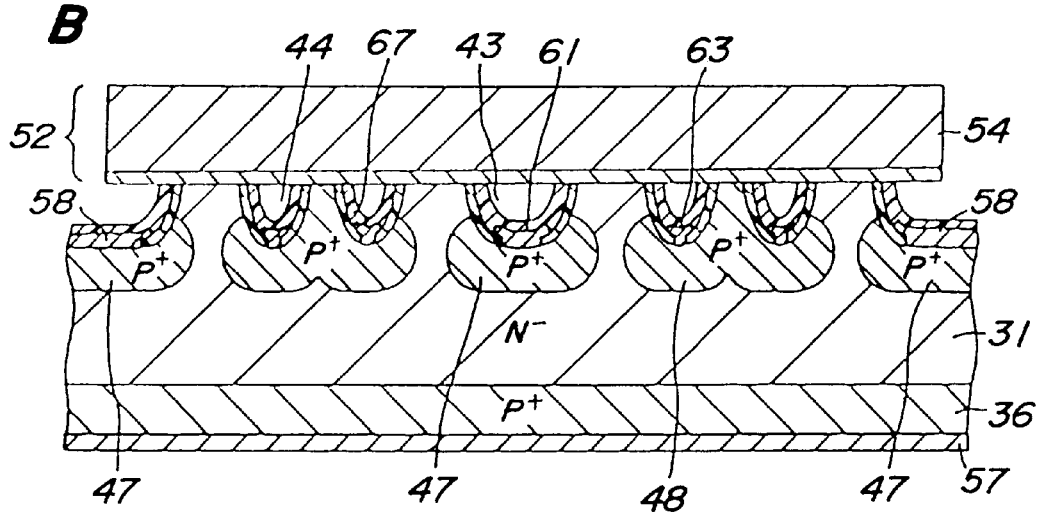

FIG. 33
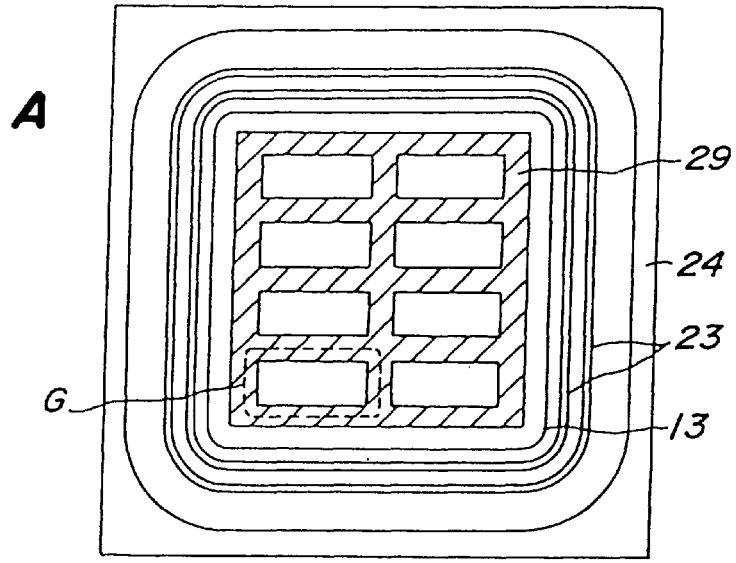
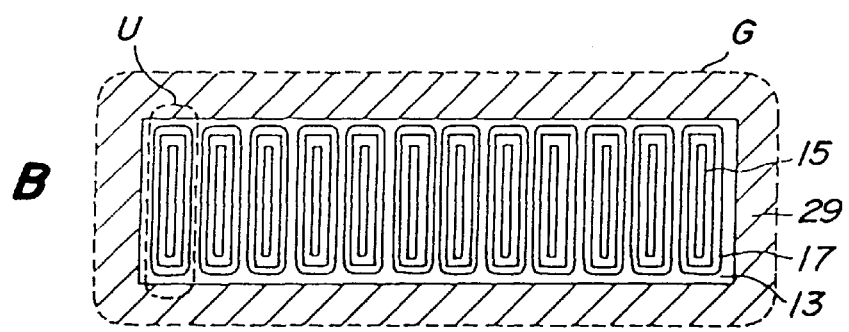
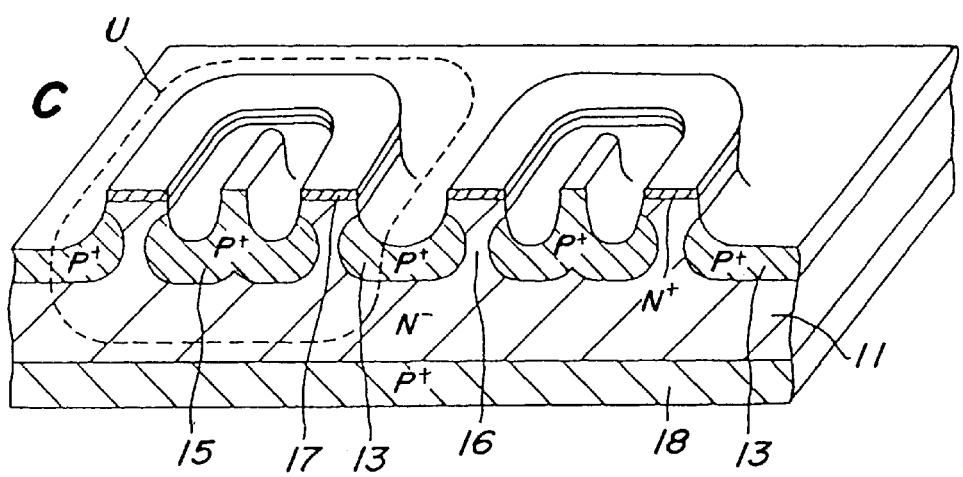

FIG. 34
A
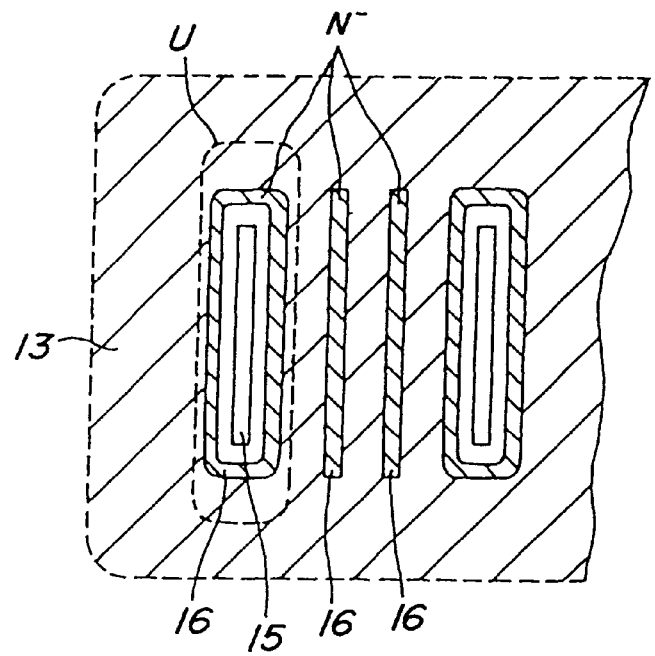
B
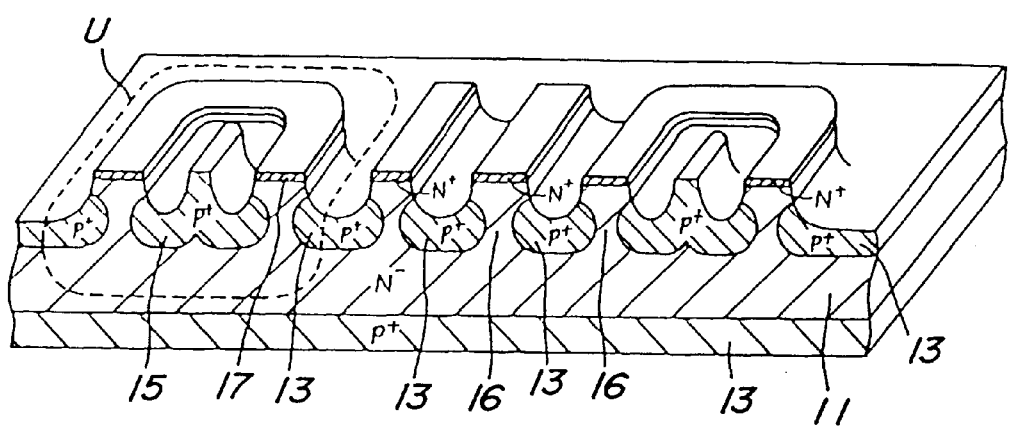

FIG_35
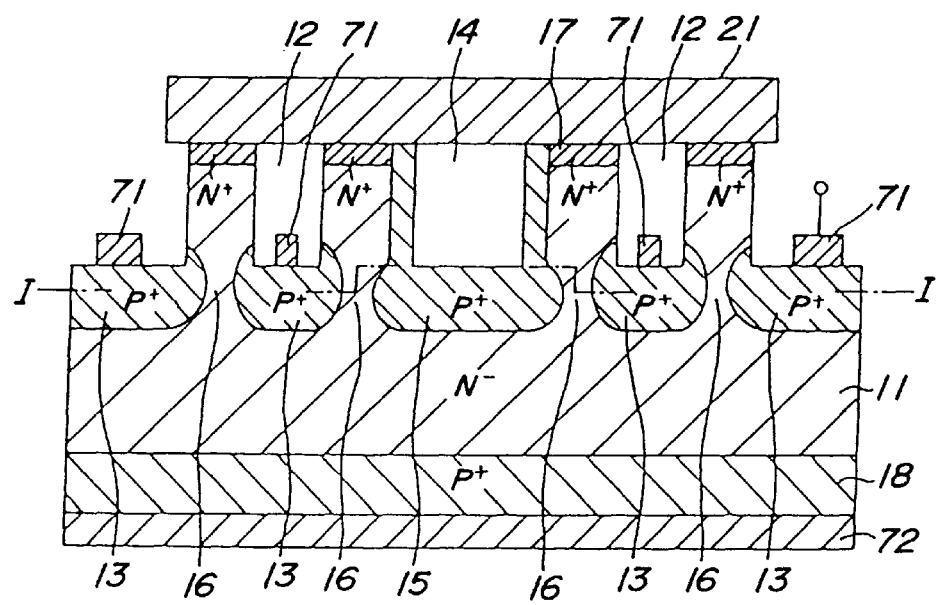
FIG_36
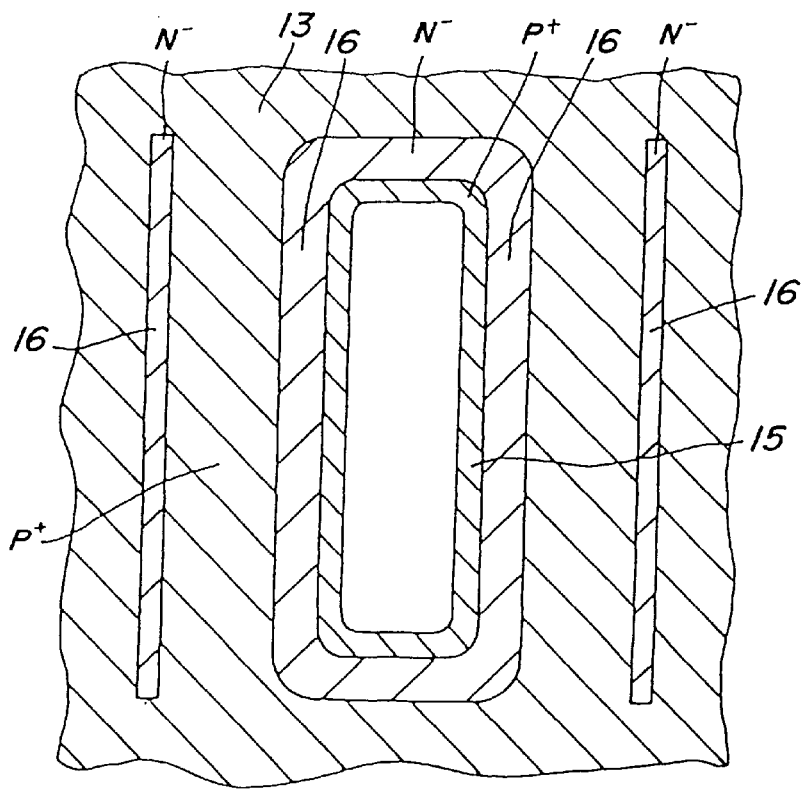

SEMICONDUCTOR DEVICE HAVING A STATIC INDUCTION IN A RECESSED PORTION

TECHNICAL FIELD

The present invention relates to a semiconductor device, and more particularly to a lateral type static induction semiconductor device having a gate region provided in a recessed portion formed in a surface of a semiconductor substrate.

BACKGROUND ART

Conventional power semiconductor devices have been commonly used as a power supply device, and have been described in the following literatures.
1. Junichi Nishizawa: "High power-lateral junction FET of the character of a triode", Nikkei Electronics, 50~61, Sep. 27, 1971
2. J. Nishizawa, T. Terasaki, and J. Sibata: "Field-Effect Transistor versus Analog Transistor (Static Induction Transistor)", IEEE Trans. on Electron Device, ED-22(4), 185 (1975)
3. J. Nishizawa and K. Nakamura: Physiquee Appliquee, T13, 725 (1978)
4. J. Nishizawa and Y. Otsubo: Tech. Dig. 1980 IEDM, 658 (1980)
5. Junichi Nishizawa, Tadahiro Omi, Moken Sha, and Kaoru Hontani: "Denshi-Tsushin Institute Technical Research Report", ED81–84 (1981)
6. M. Ishidoh et al: "Advanced High Frequency GTO", Proc. ISPSD, 189 (1988)
7. B. J. Baliga et al: "The Evolution of Power Technology", IEEE Trans. on Electron Device, ED-31, 157 (1984)
8. M. Amato et al: "Comparison of Lateral and Vertical DMOS Specific On-resistance", IEDM Tech. Dig., 736 (1985)
9. B. J. Galiga: "Modern Power Device", John Wiley Sons, 350 (1987)
10. H. Mitlehner et al: Proc. ISPSD, 289 (1990): "A Novel 8 kV Light-Trigger Thyristor with Over Voltage Self Protection"

The above mentioned static induction semiconductor device has a device structure of a short-channel and a multi-channel in order to obtain low conduction loss, large current capability, high breakdown voltage, and high speed operation. In order to improve the high speed operation among these properties, it has been known to control a lifetime of carriers by diffusing Au, Pt and so on or by performing irradiation with electron beam or proton. In order to improve the large current capability, it has been also known to increase a surface area of a semiconductor device is suggested to obtain large current.

In the conventional static induction semiconductor device, if a part of a gate region is short-circuited to a cathode electrode, a channel region could not be pinched-off by a reverse-bias voltage because a gate current for turn-off is bypassed through the short-circuited region. That is, carriers existent in a $N^-$ region (including the channel region) at turn-off could not be swept out due to the short-circuit of the gate region to the cathode region. In other words, in the semiconductor device having a large surface area, an influence of resistance between the gate region and a point at which a lead wire for the gate region is drawn out cannot be neglected. Therefore, a large current could not be cut-off at a high speed due to a fact that a voltage drop is produced by a gate current of carriers flowing from the gate region to the drawn-out point of the lead wire of the gate electrode at turn-off and the turn-off operation might be effected by this voltage drop.

Moreover, when a high speed operation is attained by controlling lifetime of carriers, there is another problem that a conduction loss is increased due to a high on-resistance.

It is an object of this invention to solve the above problems of the conventional semiconductor devices and provide a semiconductor device, in which carriers remained within the gate region and $N^-$ base region can be swept out immediately at turn-off to increase a switching speed, while the low conduction loss, large current capability and high breakdown voltage can be maintained as there are.

It is another object of this invention to provide a semiconductor device, in which a switching speed can be increased and at the same time a conduction loss is decreased by reducing on-resistance.

DISCLOSURE OF INVENTION

According to the invention, a semiconductor device is characterized in that it comprises a semiconductor substrate of one conductivity type having first recessed portions formed in one surface thereof, gate regions of the other conductivity type formed along the first recessed portions, cathode regions of the one conductivity type formed on the surface of the semiconductor substrate surrounded by the gate regions, cathode short-circuit regions of the other conductivity type surrounded by the cathode regions and channel regions formed by the semiconductor substrate of the one conductivity type, and a cathode electrode substrate made of a metal or semiconductor and being brought into contact with the surfaces of the cathode regions and cathode short-circuit regions.

In the semiconductor device according to the present invention, at turn-off, carriers existent within the channel region can be swept out directly into the cathode electrode through the island-like cathode short-circuit region of the same conductivity type as the gate region surrounding the channel region, and thus a large current can be cut-off at a high speed. That is to say, according to the invention, when a gate voltage for turn-off is applied across the gate electrode and the cathode electrode, the cathode short-circuit region ($P^+$ layer) of the other conductivity type surrounded by the cathode region ($N^+$ layer) and channel region ($N^-$ region) is isolated from gate region with a high resistance by means of a depletion layer produced in the channel region when the $P^+$ $N^-$ junction between the gate region ($P^+$ layer) and the channel region ($N^-$ region) is reverse-biased. Therefore, the gate current for turn-off is not bypassed through the cathode short-circuit region, and a normal turn-off operation can be performed. Moreover, a large current can be cut off at a high speed because holes existent within the $N^-$ region and channel region can be swept out to the cathode electrode immediately through the cathode short-circuit region, that is, a region having a low resistance. Furthermore, a switching loss can be made small and a maximum switching frequency can be made high because residual carriers at turn-off can be swept out directly to the cathode electrode at a high speed.

In a preferable embodiment of the semiconductor device according to the invention, the cathode region is provided in the form of an island which is surrounded by the second recessed portion, the cathode region is composed of plural projected portions of the other conductivity type formed in the one surface of the semiconductor substrate of the one conductivity type, the second recessed portion is formed to surround the plural projected portions of the other conductivity type, and the cathode region of the one conductivity type is formed projected portions which define said second recessed portions and gate region.

According to the invention, it is preferable to provide an insulating layer, which covers gate region of the other conductivity type formed along the first recessed portion formed in the surface of the semiconductor substrate of the one conductivity type, or a cathode electrode made of metal or semiconductor is preferably formed to be contacted with the gate region through an opening formed in the insulating layer.

Moreover, in order to reduce an on-resistance for attaining a low loss, it is preferable that the semiconductor substrate of the one conductivity type is made of silicon, and an Au—Sb, Al—Si or Al—Sb alloy layer or Al layer is formed on the surface of the cathode electrode substrate which is brought into contact with the cathode region and cathode short-circuit region, that a high impurity concentration regions of the one conductivity type is formed on the cathode region to be contacted with the cathode electrode substrate, or that a metal layer is formed on the surface of the cathode region which is contacted with the metal plate. Especially in the case of forming the above alloy layer or Al layer, good contact can be obtained under pressure during the package and good electrical contact can be attained, so that a contact resistance can be made low.

The on resistance can preferably be made low by providing gate electrodes made of a metal or semiconductor material such that the gate electrodes are brought into contact with an outer gate region of a unit composed of adjacent segments consisting of the cathode regions surrounding the cathode short-circuit through openings formed in the insulating layer. Particularly, even if the gate electrodes could not be arranged in every gate regions due to miniaturizing of an element structure, low gate resistance can be obtained easily.

Moreover, according to the invention, a semiconductor device is characterized in that it comprises a semiconductor substrate of one conductivity type, first and second group recessed portions formed in one surface of the semiconductor substrate, each having an overhang portion, cathode regions of the one conductivity type, each being formed in a surface of a mesa-type region having a high aspect ratio formed by adjacent first group recessed portions, cathode electrodes formed to be contacted with the cathode regions, channel regions of the one conductivity type formed in the mesa-type regions to have a smaller cross sectional area than of the cathode region, gate regions of the other conductivity type formed along the first recessed portions, first insulating layers formed on inner walls of the first recessed portions, gate electrodes formed to be contacted with the gate regions through openings formed in the first insulated layer, cathode short-circuit regions of the other conductivity type formed along the second recessed portions, second insulating layers formed on inner walls of the second recessed portions, conductive regions formed to be contacted with the cathode short-circuit regions through openings formed in the second insulating layers and to be contacted with the cathode electrodes, an anode region of the other conductivity type formed on the other surface of the silicon substrate, and an anode electrode formed to be contacted with the anode region.

In a preferable embodiment of such a semiconductor device, the recessed portion having the overhang portion has the cross sectional formation formed by anisotropic etching and the cross sectional formation formed by successive isotropic etching.

Moreover, it is preferable to form the cathode electrode by a plate of a conductive material, e.g. metal or semiconductor, which is brought into contact with the cathode region and conductive region. In this case, by bonding the conductive material plate to the semiconductor substrate, the plate can be connected to the cathode region and conducting region simultaneously.

BRIEF DESCRIPTION OF DRAWINGS

FIG. 5 is a cross sectional view illustrating a first step of manufacturing a semiconductor device of this invention.

FIG. 6 is a cross sectional view showing a next step.

FIG. 7 is a cross sectional view showing a next step.

FIG. 11 is a cross sectional view showing a next step.

FIG. 12 is a cross sectional view showing a next step.

FIG. 13 is a cross sectional view showing a next step.

FIG. 14 is a cross sectional view showing a next step.

FIG. 15 is a cross sectional view showing a next step.

FIG. 16 is a cross sectional view showing a next step.

FIG. 17 is a cross sectional view showing a next step.

FIG. 18 is a cross sectional view showing a next step.

FIG. 19 is a cross sectional view showing a next step.

FIG. 20 is a cross sectional view showing a next step.

FIG. 21 is a cross sectional view showing a next step.

FIG. 22 is a cross sectional view showing a next step.

FIG. 23 is a cross sectional view showing a next step.

FIGS. 29A and 29B are cross sectional views depicting the structure of another embodiment of the semiconductor device according to the invention.

FIGS. 30A and 30B are cross sectional views illustrating another embodiment of the semiconductor device according to the invention.

FIGS. 31A and 31B are cross sectional views showing the structure of another embodiment of the semiconductor device according to the invention.

FIGS. 33A, 33B and 33C are a plan view showing the structure of another embodiment of the semiconductor device according to the invention, a plan view showing the structure of elements group, and a perspective view illustrating the structure of element unit, while a part thereof is shown in cross section, respectively.

FIGS. 34A and 34B are a cross sectional view and a perspective view showing the structure of another embodiment of the semiconductor device according to this invention.

FIG. 35 is a longitudinal cross sectional view showing the structure of another embodiment of the semiconductor device according to the present invention.

FIG. 36 is a cross sectional view cut along a line I—I in FIG. 35.

BEST MODE FOR CARRYING OUT INVENTION

Figure 1:
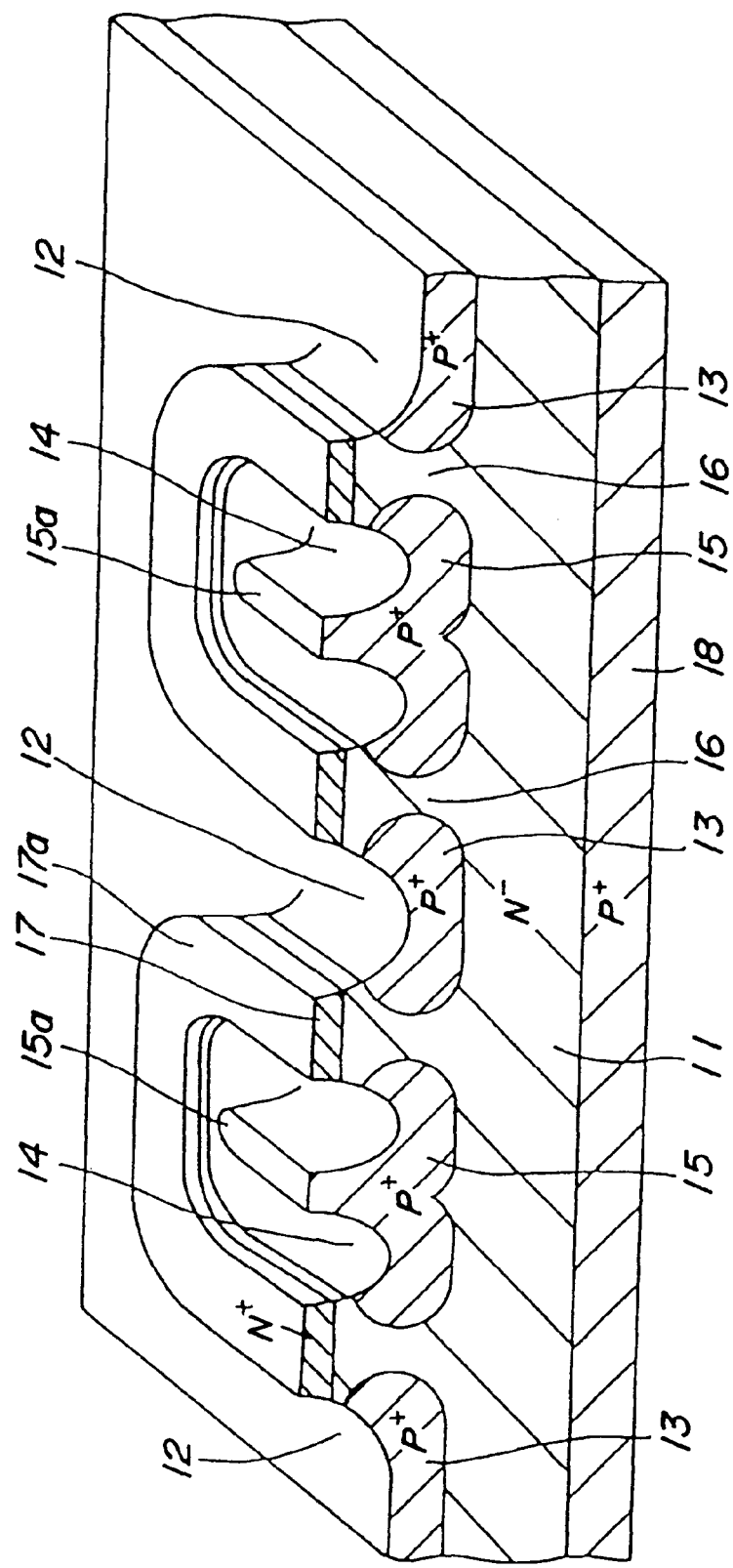
FIG. 1 is a perspective view showing a positional relation of gate region and cathode short-circuit region in an embodiment of the semiconductor device according to the invention, while a part thereof is shown in cross section.
Figure 2:
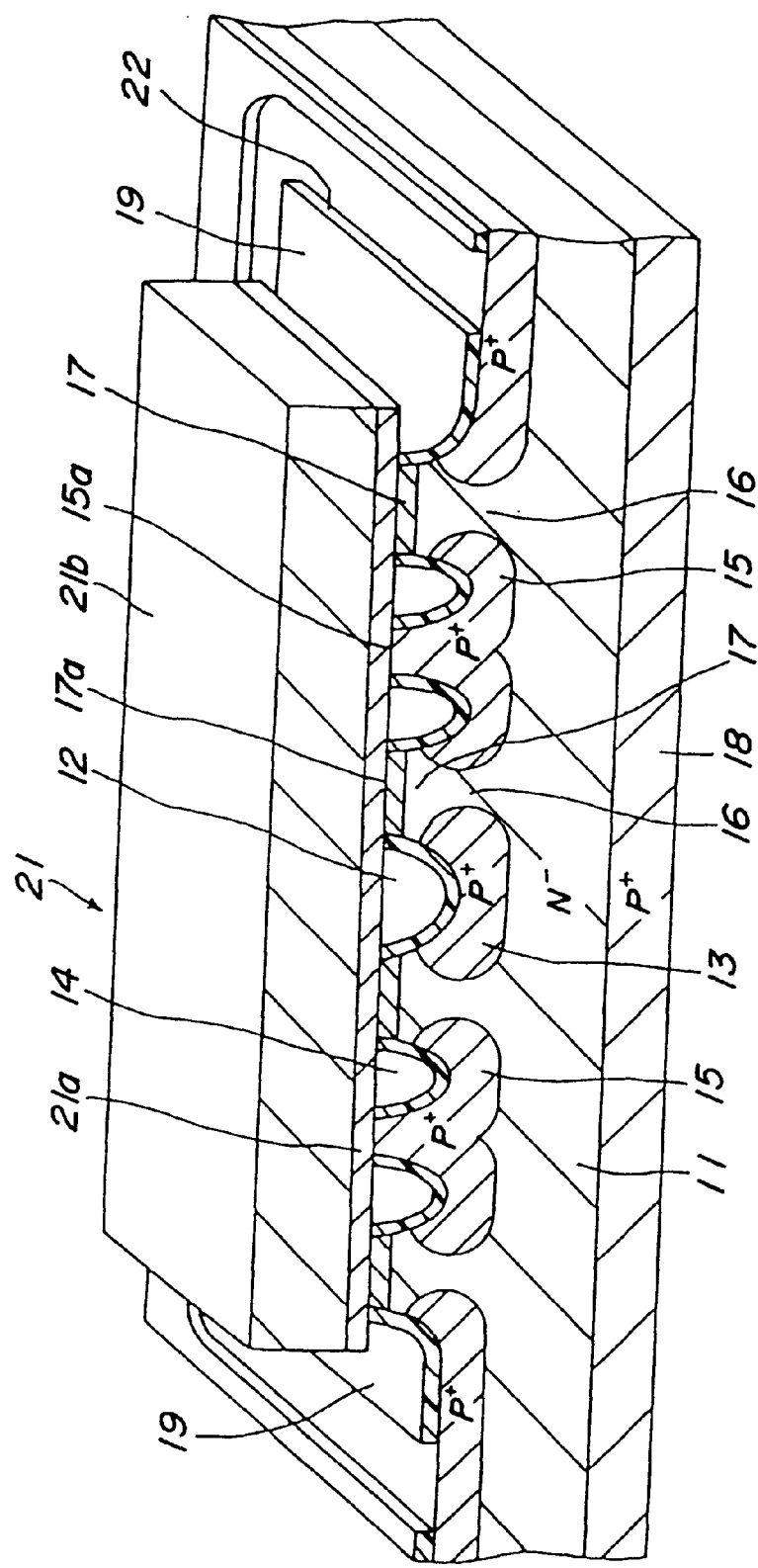
FIG. 2 is a perspective view illustrating a condition in which a cathode electrode substrate is bonded, while a part thereof is shown in cross section.
Figure 3:
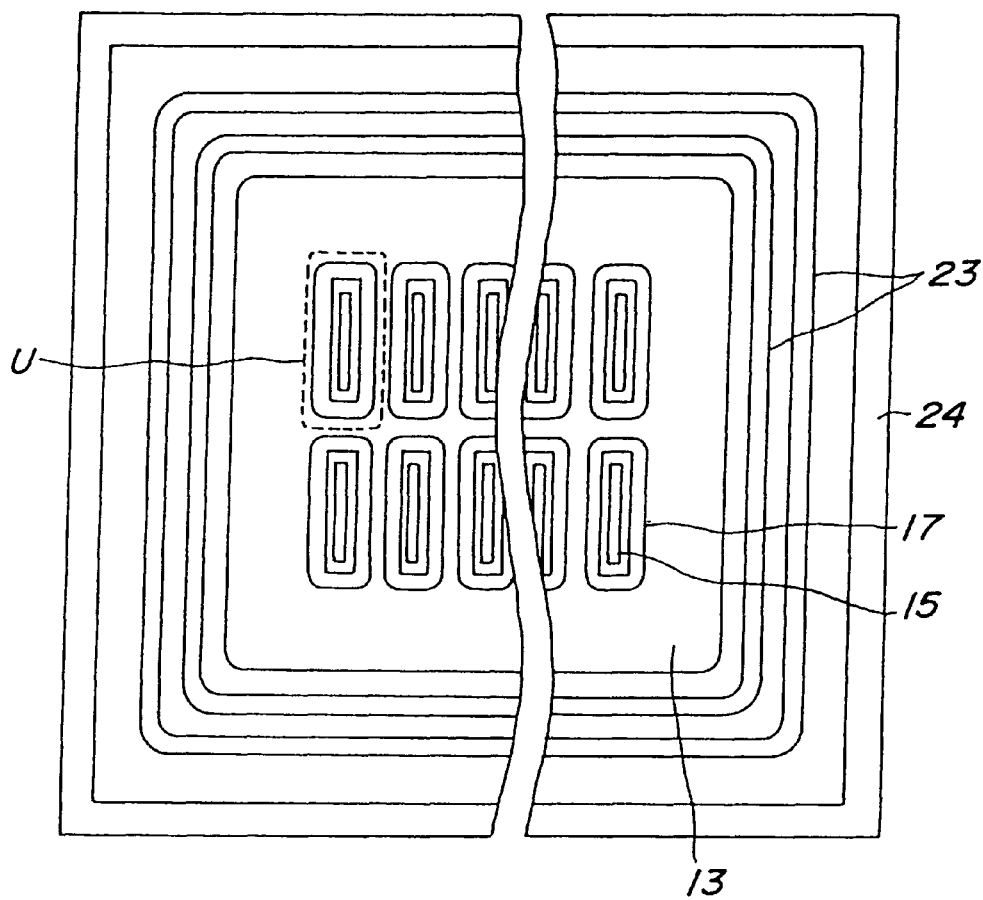
FIG. 3 is a plan view depicting a condition before the cathode electrode substrate is bonded.
Figure 4:
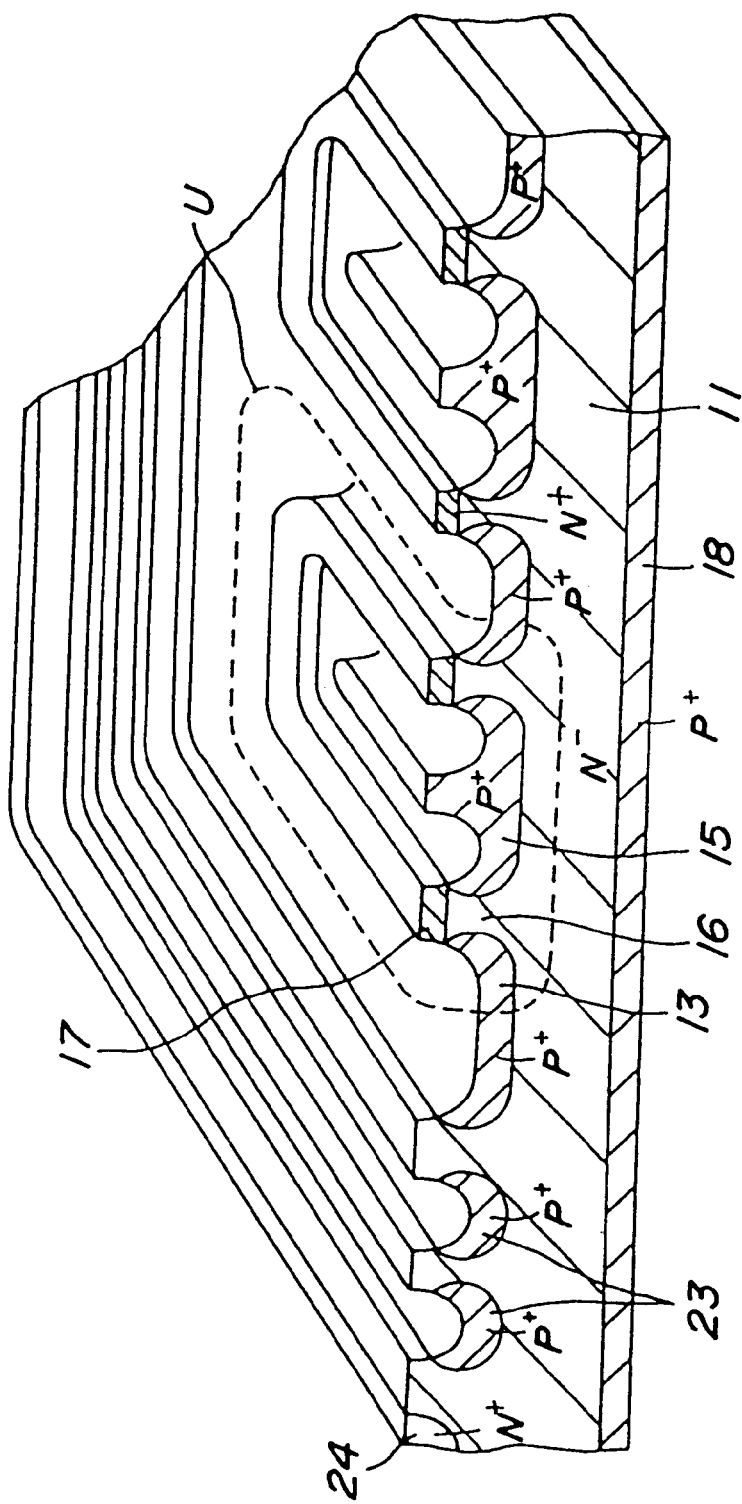
FIG. 4 is a perspective view showing an arrangement of field-limiting ring and channel stopper, while a part thereof is shown in cross section.

FIGS. 1–4 show in detail the structure of an embodiment of the semiconductor device according to this invention. FIG. 1 is a perspective view showing an arrangement of gate region and cathode short-circuit region, while a part thereof is shown in cross section, FIG. 2 is a perspective view illustrating a condition in which a cathode electrode substrate is provided, while a part thereof is shown in cross section, FIG. 3 is a plan view depicting a condition before stacking the cathode electrode substrate, while a part thereof is shown in cross section, and FIG. 4 is a perspective view showing an arrangement of the field-limiting ring and channel stopper and the element unit, while a part thereof is shown in cross section.

As shown in FIG. 1, in one surface of an N⁻ silicon substrate 11, there are formed recessed portions 12, and P⁺ gate regions 13 are formed by diffusing P-type impurities from the recessed portions 12 into the substrate. In a surface portion of the silicon substrate 11 surrounded by the recessed portions 12, there are formed recessed portions 14. P⁺ cathode short-circuit regions 15 are formed by diffusing P-type impurities from the bottoms of the recessed portions 14 into the substrate. Channel regions 16 are formed by regions of silicon substrate 11 situating between the cathode short-circuit regions 15 and the gate regions 13. N⁺ cathode regions 17 are formed by regions of the silicon substrate 11 extending from the channel regions 16 up to the surface of the silicon substrate. In this manner, according to the present invention, the cathode short-circuit region 15 is provided in the form of an island which is surrounded by the recessed portion 14. A top surface 15a of the cathode short-circuit region 15 has the same level as the surface 17a of the cathode region 17 because both of them are formed by the surface of the silicon substrate 11. A P⁺ anode region 18 is formed on the other surface of the silicon substrate 11.

After forming a silicon oxide layer on the one surface of the silicon substrate 11, parts of the silicon oxide film formed on the surfaces 15a of the cathode short-circuit regions 15 and surfaces 17a of the cathode regions 17 are selectively removed, and a cathode electrode substrate 21 is provided as shown in FIG. 2. In this embodiment, the cathode electrode substrate 21 is formed by a metal plate having a high heat dispassion property and having an Au—Sb layer 21a which is ohmically contacted to the silicon substrate 11. As stated above, since the surfaces 15a of the cathode short-circuit regions 15 and surfaces 17a of the cathode regions 17 have the same level, the cathode electrode substrate 21 is brought into contact with both the cathode short-circuit region 15 and the cathode region 17. Further, a contact hole 22 for the gate is formed in the silicon oxide layer at a position which is remote from the cathode electrode substrate 21.

In the present invention, the cathode short-circuit region 15 having the same conductivity type as the gate region 13 is formed such that the cathode short-circuit region is surrounded by the channel region 16 having the other conductivity type (N-type) and the cathode short-circuit region 15 is connected to the cathode electrode substrate 21 together with the cathode region 17, and therefore the cathode short-circuit region 15 is electrically isolated from the gate region 13 by the depletion layer generated in the channel region 16 due to a fact that a PN junction formed between the gate region 13 and the channel region 16 is reversed-biased. As a result of this, a gate turn-off current does not bypass the cathode short-circuit region 15 and a normal turn-off operation can be performed. Moreover, holes stored within the N-type region 11 and channel region 16 can be swept out into the cathode electrode substrate 21 through the cathode short-circuit region 15. Therefore, a current flowing between the gate and the cathode is small and a drop of the gate turn-off voltage does not occur, so that a large current can be cut off. A switching loss can be small and a maximum switching frequency can be high because residual carriers can be swept out immediately.

FIG. 3 is a view showing a condition before the cathode electrode substrate 22 is provided. The N⁺ cathode region 17 is surrounded by the P⁺ gate region 13 and the P⁺ cathode short-circuit region 15 is formed as an island surrounded by the cathode region. A P⁺ field limiting ring 23 is formed beyond the gate region 13 and a channel stopper 24 is formed beyond the field limiting ring. As illustrated in FIG. 4, the field limiting ring 23 is constructed by forming the recessed portion in the surface of the silicon substrate 11 and by diffusing P-type impurities from the recessed portion into the substrate. The channel stopper 24 is composed of an N⁺ diffusion region formed by diffusing N-type impurities from the surface of the silicon substrate 11. In FIGS. 3 and 4, a portion surrounded by a broken line constitutes a single element unit.

Next successive steps for manufacturing the semiconductor device according to the present invention will be described with reference to FIGS. 5–28.

At first, as shown in FIG. 5, N-type impurities are introduced into an N-type silicon substrate with an impurity concentration of $1 \times 10^{12} – 10^{14}$ atom/cm³ and then a surface of the silicon substrate is cleaned sufficiently. Then, as illustrated in FIG. 6, a silicon oxide layers 32 and 33 are formed on the surface of the silicon substrate by heating it in atmosphere of oxygen or aqueous vapor.

Figure 8:
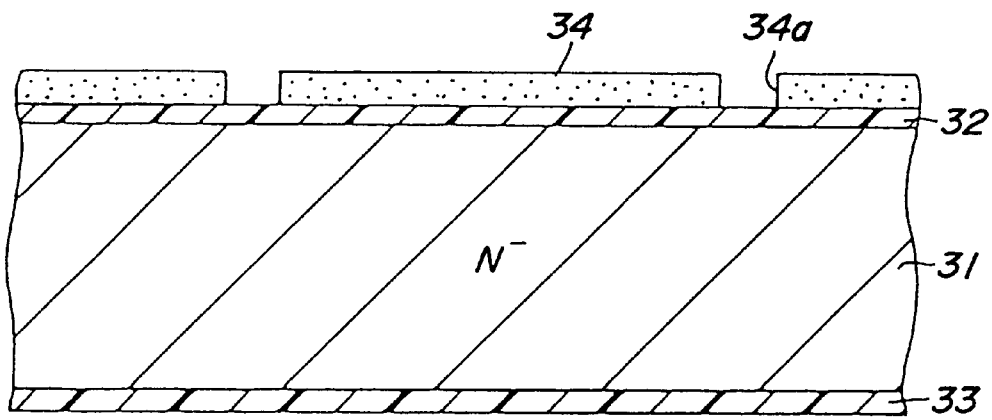
FIG. 8 is a cross sectional view showing a next step.
Figure 9:
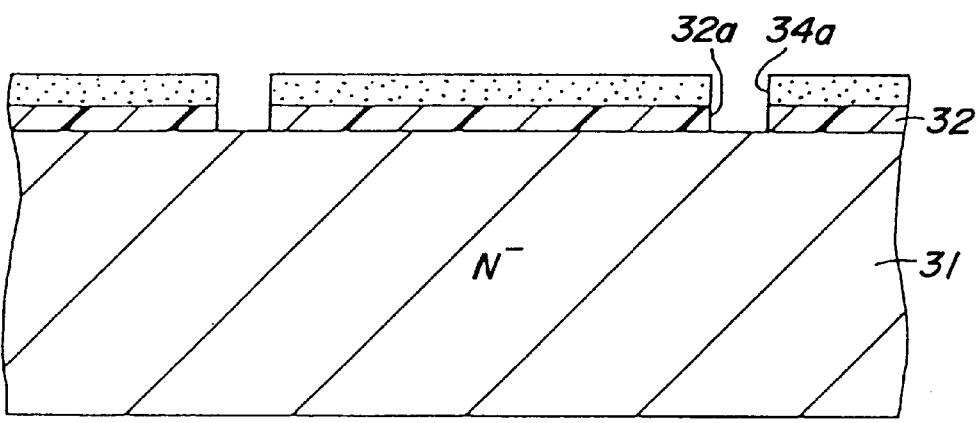
FIG. 9 is a cross sectional view showing a next step.

Next, a photoresist layer 34 is applied on the silicon oxide layer 32 as depicted in FIG. 7, and then the photoresist layer 34 is selectively removed by photolithography and openings 34a are formed in the photoresist layer at portions where cathode short-circuit regions are to be formed later as illustrated in FIG. 8. Subsequently, openings 32a are formed in the silicon oxide layer 32 by etching, while the photoresist layer 34 having the openings 34a formed therein is used as a mask. Then, a silicon oxide layer 33 formed on a rear surface of the silicon substrate is removed by etching as shown in FIG. 9.

Figure 10:
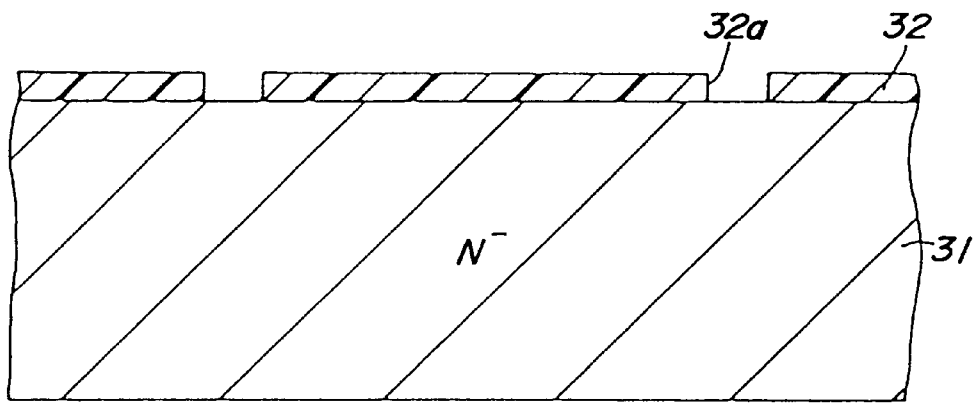
FIG. 10 is a cross sectional view showing a next step.

Next, as shown in FIG. 10, the photoresist layer 34 is removed by peeling-off, and P-type boron impurities are diffused into the silicon substrate through the openings 34a to form P+ diffusion regions 35 which constitute cathode short-circuit regions, and a P+ anode region 36 is formed by diffusing boron impurities into the rear surface of the silicon substrate as shown in FIG. 11. Silicon oxide layers 37 and 38 are formed on the P+ diffusion region 35 and P+ anode region 36, respectively.

Subsequently, as depicted in FIG. 12, the silicon oxide layers 32, 37, and 38 are removed by etching, and silicon oxide layers 39 and 40 are newly deposited on both surfaces of the silicon substrate 31 by TOES-CVD.

Next, as shown in FIG. 14, photoresist layers 41 and 42 are applied on both the surfaces of the silicon substrate 31, and then openings 41a are formed in the photoresist layer 41 by photolithography as illustrated in FIG. 15. Then, as shown in FIG. 16, openings 39a are formed in the silicon oxide layer 39 by etching, while the photoresist layer 41 is used as a mask. Then, the photoresist layers 41 and 42 formed on the front and rear surfaces of the silicon substrate are removed by peeling-off.

Subsequently, recessed portions 43 and 44 are formed in the surface of the silicon substrate 31 by performing the etching through the openings 39a formed in the silicon oxide layer 39 as depicted in FIG. 18. The recessed portion 43 defines the gate region and the recessed portion 44 defines the cathode short-circuit region. The P+ diffusion regions 35 constituting the cathode short-circuit regions are exposed to the side walls of the recessed portions 43.

Next as shown in FIG. 19, surfaces of the silicon substrate 31 exposed to the recessed portions 43 and 44 are covered with silicon oxide layers 45 and 46, respectively by thermal oxidation treatment. In this case, the recessed portion 43 is covered with the silicon oxide layer 45 and the recessed portion 44 is covered with the silicon oxide layer 46. Next as depicted in FIG. 20, openings 45a are formed in the silicon oxide layers 45 covering the recessed portions 43 and openings 46a are formed in the silicon oxide layers 46 covering the recessed portions 44 by the anisotropic etching, for example, reactive ion etching, while the silicon oxide layer 39 having the openings 39a is used as mask.

Then, P-type boron impurities are diffused into the silicon substrate through the openings 45a and 46a formed in the silicon oxide layers 45 and 46 to form P+ gate regions 47 and P+ short-circuit regions 48 at bottoms of the recessed portions 43 and 44, respectively as shown in FIG. 21. In this case, the P+ cathode short-circuit region 48 constitutes, together with the previously formed P+ diffusion region 35 formed in the surface of the silicon substrate 31, an island-like region which extends up to the surface of the silicon substrate. During this diffusion step, the openings 45a and 46a formed in the silicon oxide layers 45 and 46 are covered with silicon oxide layers (BSG layer) 49.

Subsequently as shown in FIG. 22, by removing the silicon oxide layer 39 by polishing, surfaces 48a of the cathode short-circuit regions 48 and surfaces 51a of cathode regions 51 which are connected to channel regions 50 surrounded by the gate regions 47 and cathode short-circuit regions 48 are exposed. These exposed surfaces 48a and 51a have the same level.

Next as illustrated in FIG. 23, a cathode electrode substrate 52 is stuck to the surface of the silicon substrate 31. The cathode electrode substrate 52 may be composed of a Mo or W plate 54 having a thermal expansion coefficient which is substantially identical with that of Si and an Au—Sb layer 53 applied on a surface of the plate 54, and may be bonded to the surface of the silicon substrate 31 by the alloy method. The cathode short-circuit region 48 and cathode region 51 are both connected to the cathode electrode substrate 52 at the same time by bonding the cathode electrode substrate 52 to the silicon substrate 31 because the surface 48a of the cathode short-circuit region 48 has the same level as the surface 51a of the cathode region 51.

Figure 24:
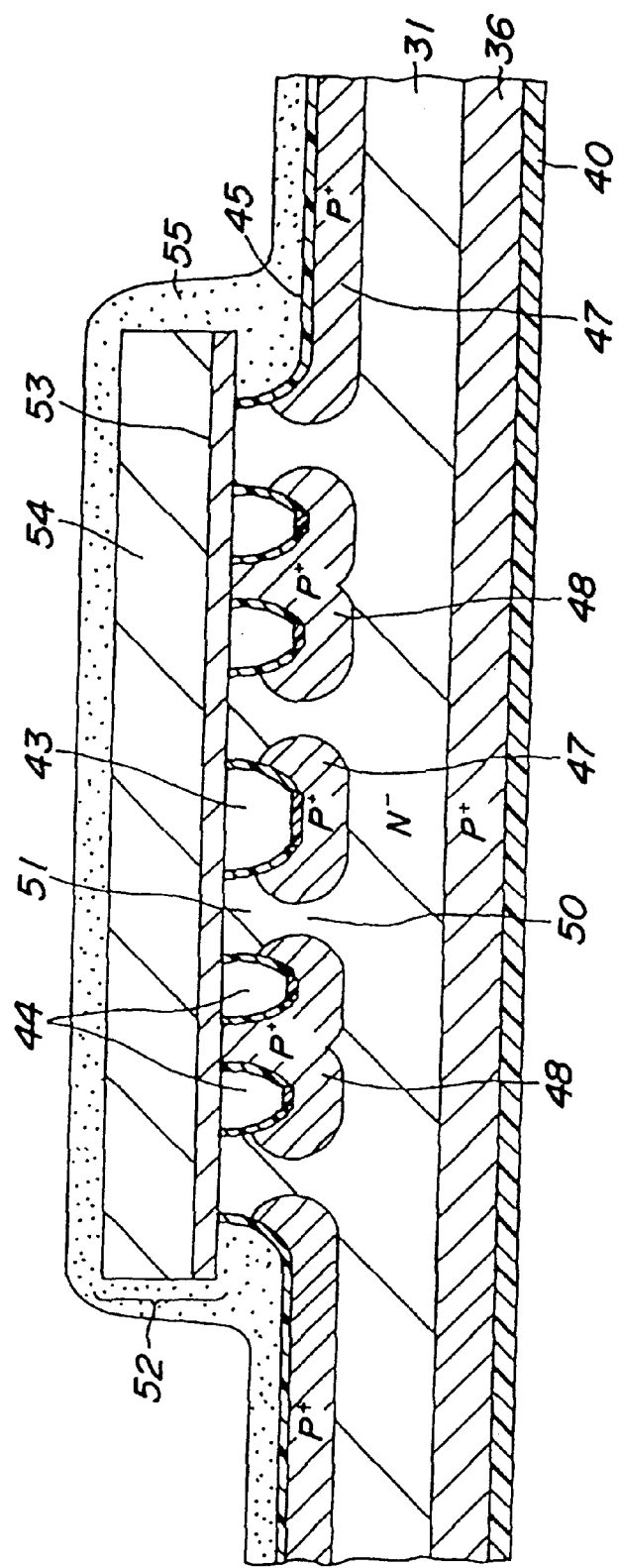
FIG. 24 is a cross sectional view showing a next step.
Figure 25:
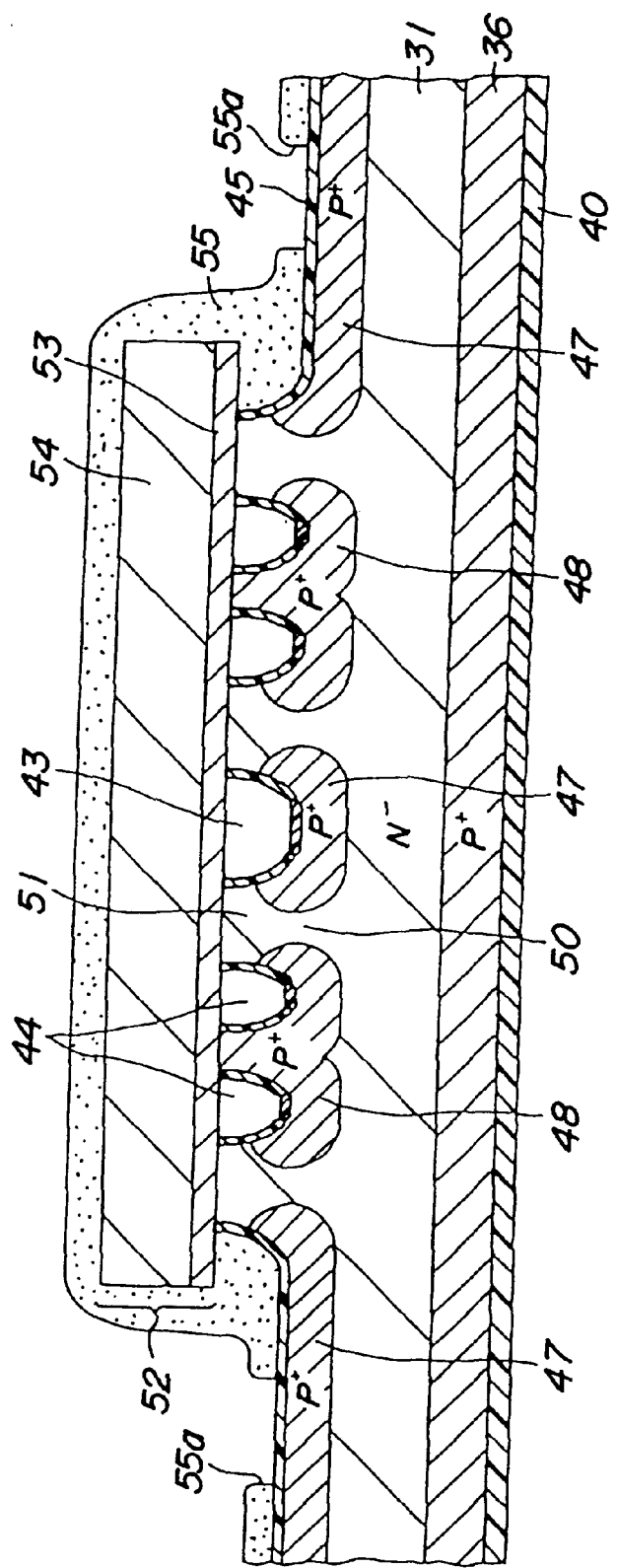
FIG. 25 is a cross sectional view showing a next step.
Figure 26:
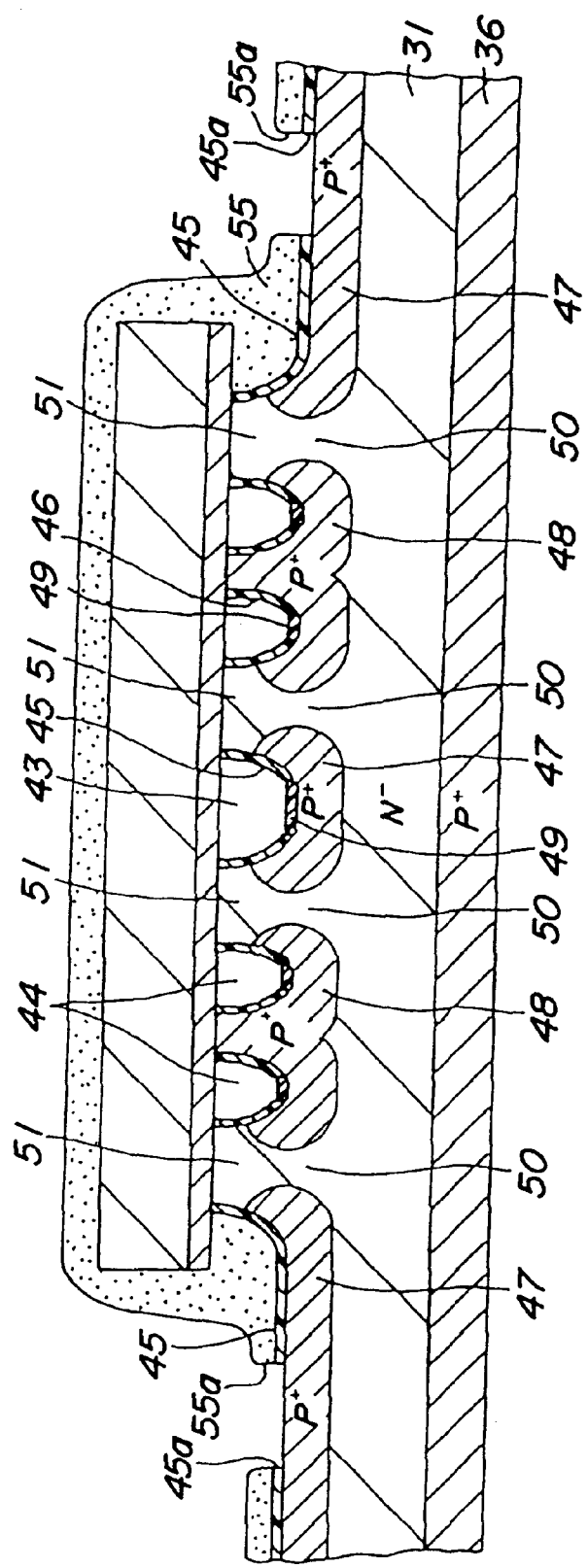
FIG. 26 is a cross sectional view showing a next step.

Next, as shown in FIG. 24, a photoresist layer 55 is applied on the whole surface of the assembly, and thereafter a opening 55a is formed in the photoresist layer 55 by photolithography as illustrated in FIG. 25. The opening 55a is used to form a contact to the gate region 47 and is formed at a portion not covered with the cathode electrode substrate 52. In FIG. 26, a contact hole 45a is formed in the silicon oxide layer 45 by performing the etching through the opening 55a as shown in FIG. 26. At the same time, the silicon oxide layer 40 formed on the rear surface of the silicon substrate is removed by the etching.

Figure 27:
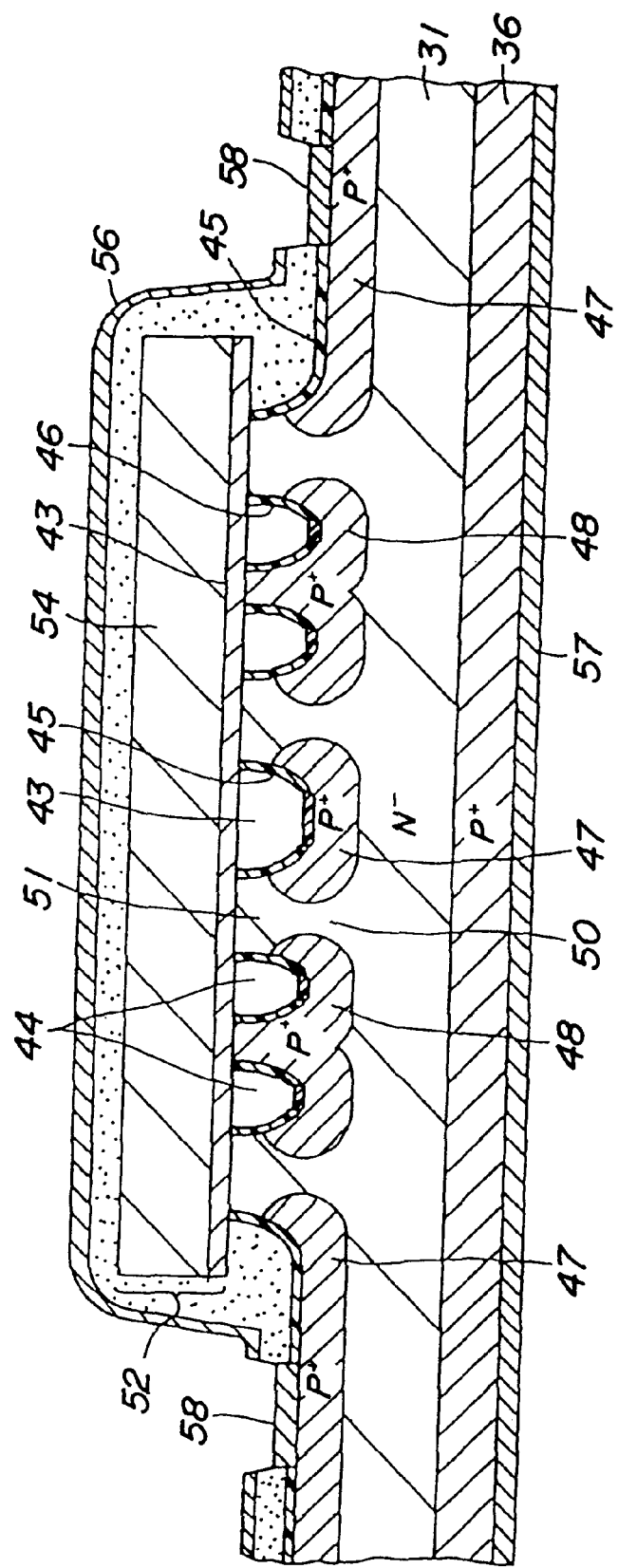
FIG. 27 is a cross sectional view showing a next step.
Figure 28:
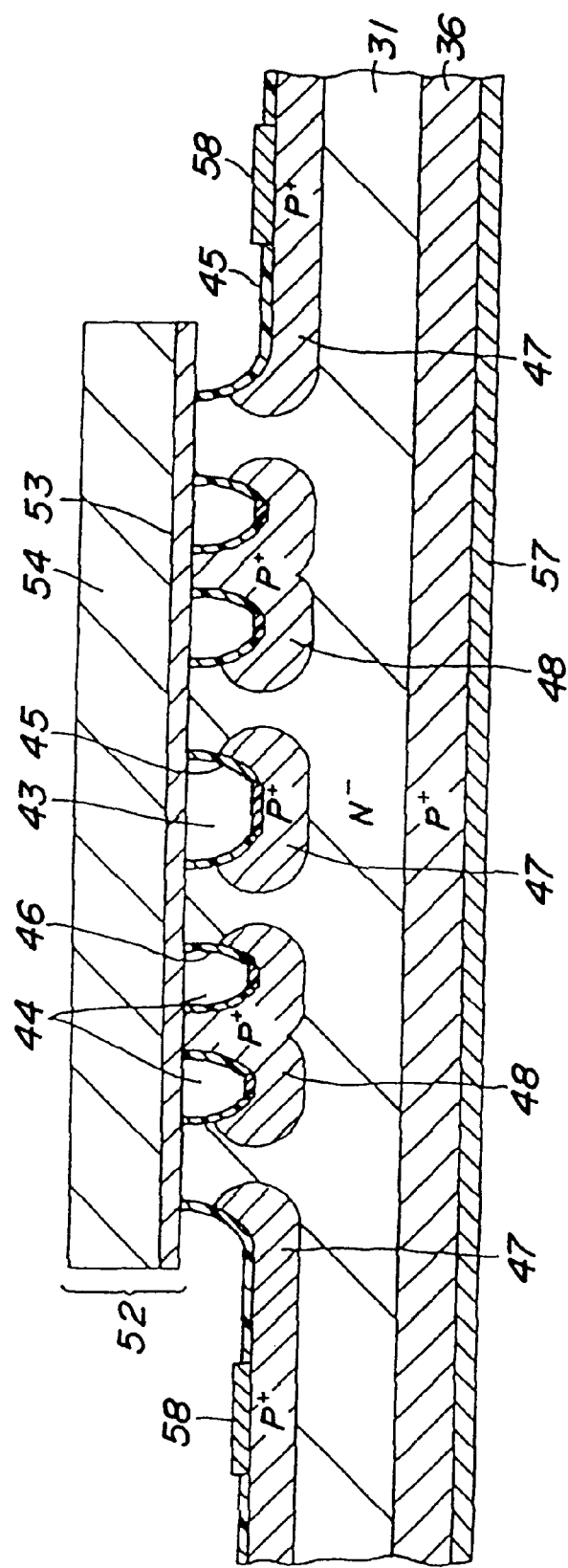
FIG. 28 is a cross sectional view showing a next step.

Moreover, as depicted in FIG. 27, aluminum layers 56 and 57 are formed on the front and rear surfaces of the assembly by evaporating aluminum. In this case, aluminum layers 58 serving as gate electrodes are formed within the contact holes 45a. Finally, as shown in FIG. 28, the aluminum layer 56 on the surface of the silicon substrate 31 is removed by lift-off.

This invention is not limited to the above explained embodiments, but any alternations and modifications may be conceived.

FIGS. 29–32 show several embodiments of the semiconductor device according to the present invention. In these figures, A and B show the condition before and after a cathode electrode substrate is bonded to the semiconductor substrate. In these embodiments, portions similar to those of the above mentioned embodiments are denoted by the same reference numerals used in the previous embodiments, and a similar explanation is dispensed with as far as possible.

In the embodiment shown in FIG. 29, gate electrodes are formed on the respective gate regions 47 formed in the recessed portions 43. In the above embodiment, the gate regions 47 formed in the recessed portions 43 are completely covered with the insulated layers 45 and 49, but in the embodiment shown in FIG. 29, gate electrodes 61 are brought into contact with the gate regions 47 through the openings formed in the silicon oxide layer 45 covering the recessed portions 43 (these openings are preferably formed as the openings for performing the diffusion in order to form the gate regions 47 in a self-alignment manner). The gate electrodes 61 may be formed integrally with the gate electrodes 58 brought into contact with the outermost gate region in the above embodiment. Moreover in the present embodiment, an anode electrode 57 is formed on the surface of an anode region 36.

As mentioned above, after forming the gate electrodes 58 and 61 to be contacted with the gate regions 47 formed in the recessed portions, a cathode electrode substrate 52 composed of an Au—Sb alloy layer 53 and a conductive plate 54 made of a metal or semiconductor material is bonded to the surface of the silicon substrate 31 as illustrated in FIG. 29B.

In this embodiment, since the gate electrodes 61 are brought into contact with the gate regions 47, the gate resistance can be decreased and the gate bias can be effectively applied, and thus high speed and stable operation can be attained.

In the embodiment shown in FIG. 30A, N+ contact regions 62 are formed on the cathode regions 51. As depicted in FIG. 30B, the cathode electrode substrate formed by a metal plate 54 is bonded to the silicon substrate. By forming the N⁺ contact regions 62 having a high impurity concentration in the surfaces of the cathode region 51s, the contact-resistance can be decreased, and the on-resistance can be decreased, as a result of which loss can be lowered.

The embodiment shown in FIG. 31 is a modification of the embodiment of FIG. 29. In the embodiment illustrated in FIG. 29, the gate electrodes 61 are formed to be contacted to the gate regions 47, but in this embodiment, the electrodes 63 are formed to be contacted to the respective cathode short-circuit regions 48. These electrodes 63 are kept at a floating potential during the operation and does not influence the operation of the element, but the manufacturing process can be simplified. In the embodiment shown in FIG. 29, the gate electrodes 61 are formed to be brought into contact only with the gate regions 47, and thus it is impossible to form the openings only in the silicon oxide layer 45 for forming the gate electrodes 61 by using the mask which is used for forming both the openings 45a and 46a for the gate regions 47 and cathode short-circuit regions 48. Thus, another mask has to be used and the advantage of the self-alignment could not be obtained. In this embodiment, not only the gate electrodes 61 are formed to be contacted with the gate regions 47, but also the electrodes 63 are formed to be contacted with the cathode short-circuit regions 48, and therefore the openings can be formed in the silicon oxide layers 45 and 46 by using the mask for forming the openings 45a and 46a and the advantage of the self-alignment can be obtained.

As stated above, after forming the gate electrodes 61 to be contacted with the gate regions 47 and the electrodes 63 to be contacted with the cathode short-circuit regions 48 through the openings in the silicon oxide layer 46, the cathode electrode substrate 52 formed by the Au—Sb alloy layer 53 and the metal or semiconductor plate 54 is bonded to the silicon substrate 31 as illustrated in FIG. 31B. In this embodiment, similar to the embodiment shown in FIG. 29, the gate electrodes 61 formed in the each recessed portions are formed to be united with the gate electrode 58 formed on the outermost gate region. However the electrodes 63 formed on the cathode regions 48 are not connected to any regions.

In this embodiment like as the embodiment shown in FIG. 29, the low gate resistance, stable and high speed operation can be performed, and the gate electrodes 61 can be formed in a self-alignment manner, and therefore the semiconductor device can be easily manufactured at a low cost and can be miniaturized.

Figure 32:
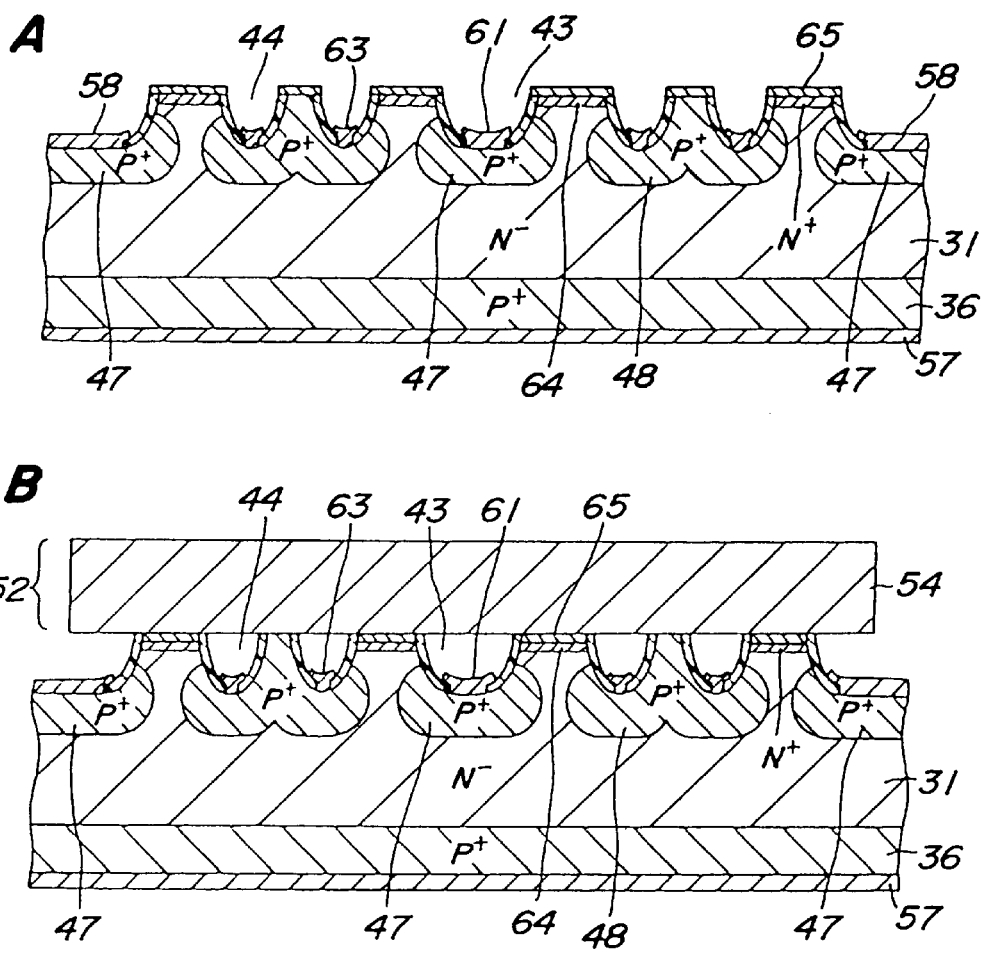
FIGS. 32A and 32B are cross sectional views representing the structure of another embodiment of the semiconductor device according to the invention.

FIG. 32 shows another embodiment of the semiconductor device in accordance with the present invention. Like as the embodiment shown in FIG. 31, in the present embodiment, the gate electrodes 61 are formed to be contacted with the gate regions 47 formed at the respective recessed portions 43 and the electrodes 63 are formed to be contacted with the cathode short-circuit regions 48. In this embodiment, as illustrated in FIG. 32A, N⁺ emitter regions 64 are formed in the surfaces of the respective cathode regions 51, and metal layers, for example, aluminum layers 65 are formed on the respective emitter regions. Passivation resin layers 67 (for example, silicone resin layers or polyimide resin layers) are formed on the inner surfaces of the recessed portions 43 and 44 to cover the electrode 58, 61, and 63. As depicted in FIG. 32B, the cathode electrode substrate 52 made of a metal plate 54 is brought into contact with the metal plate 65 under pressure or by bonding.

FIG. 33 shows the construction another embodiment of the semiconductor device according to the invention. In the embodiments shown in FIGS. 29, 31 and 32, the gate electrodes 61 are formed to be contacted with the gate regions 47 formed at the respective recessed portions, but when the element structure is further miniaturized, it becomes sometimes difficult to form the gate electrodes 61 to be contacted with all the gate regions 47. The present embodiment provides a structure in which the gate resistance can be reduced even in such a case.

FIG. 33A is a view showing a condition before bonding the cathode electrode substrate. Like as the embodiment illustrated in FIG. 3, the N⁺ channel stopper 24 is formed on the outermost side of the silicon substrate 11 and two P⁺ field-limiting rings 23 are formed on the inner side of the channel stopper. Plural element groups G each including a plurality of element units are arranged within the region surrounded by the innermost field-limiting ring 23.

FIG. 33B shows the structure of one element unit G. In this embodiment, the structure is formed by arranging a plurality of element units U within the each element group G. FIG. 33C shows the structure of one element unit U. In this embodiment, a P⁺ cathode short-circuit regions 15 are formed in a shape of an island on the surface of the silicon substrate 11, and the cathode short-circuit regions are surrounded by the N⁺ projected cathode regions 17 which extent up to the surface of the silicon substrate, and the P⁺ gate region 13 is formed to surround these cathode regions.

As shown in FIG. 33B, the gate region 13 is formed to surround a plurality of element units U within the element group G and the gate electrode 29 is formed to be contacted with the gate region at a portion which surrounds the element group G of the gate region 13. As shown in FIG. 33A, the gate electrode 29 is formed integrally for all the element groups G. In FIGS. 33A and 33B, the gate electrode 29 is shown by hatching for the sake of clarity.

In this embodiment, the gate electrode 29 can be formed to surround a plurality of elements within the each element groups G even if a space between adjacent elements is so small that the gate electrode could not be formed. Thus, the gate resistance can be reduced and the gate bias can be effectively applied and the drawn-out of minority carriers can be effected at a high speed, and high speed switching can be performed in a stable manner.

In the present embodiment, the gate electrode 71 is formed only on the outer gate region 13 not surrounded by the cathode electrode 21 and the gate electrode is not formed under the cathode electrode. In this device, holes are injected from all the gate regions 13 (P⁺ layer) which surround the channel region 16 into the channel region when the gate voltage is applied across the gate and the cathode such that a potential on the gate becomes positive. On the other hand, holes are not injected from the cathode short-circuit region 15 into a P⁺N⁻ junction because the junction formed by the cathode short-circuit region 15 (P⁺ layer) and the channel region 16 (N⁻ layer) are reverse-biased by the applied gate voltage. Thus the on-resistance (on-voltage) of this device is lowered than the above mentioned first embodiment.

FIG. 34 shows a modification of the embodiment shown in FIG. 33, and FIGS. 34A and 34B correspond to FIGS. 33B and 33C, respectively. In this embodiment, the same reference numerals are used to denote similar portions to those of the previous embodiment and their detailed description is omitted. In this embodiment, two normal SI thyristor structures SI without the cathode short-circuit region are arranged between adjacent element units U. The on-resistance can be reduced when the normal thyristor structures SI are formed. The number of the normal thyristor structures SI is optional, but the number of the normal thyristor structures arranged in parallel is increased when the low on-resistance is required and the number is decreased when high speed turn-off operation of large current is required.

FIG. 35 is a longitudinal sectional view showing the structure of another embodiment of the semiconductor device according to the present invention and FIG. 36 is a lateral cross sectional view cut along a line I—I in FIG. 35. In this embodiment, portions similar to those if the first embodiment shown in FIGS. 1–4 are denoted by the same reference numerals used in the first embodiment. In the first embodiment, the portion of the cathode short-circuit region 15 contacted with the cathode electrode 21 is surrounded by the second recessed portion 14, but in the present embodiment, a cathode short-circuit region 15 is formed to be extended along the inner surface of the second recessed portion 14. Therefore, the cathode short-circuit region 15 is formed in the shape of an island which is surrounded by the channel region 16 formed by the N⁻ silicon substrate 11. In the case of forming such a structure, the recessed portion 14 is first formed and then P-type impurities are diffused from the side wall of the recessed portion to form the P⁺ cathode short-circuit region 15. In this manner, the recessed portion 14 is needed to form the cathode short-circuit region 15.

Moreover in this embodiment, the gate regions 13 are exposed at the bottoms of the first recessed portions 12 and gate electrodes 71 are formed on the exposed surfaces of the gate regions. Thus, the gate electrodes 71 are formed not only on the outer gate regions which are not covered with the cathode electrodes 21, but also under the cathode electrodes 21. As shown in FIG. 36, these gate electrodes 71 are formed as a single integrally united electrode layer.

Figure 37:
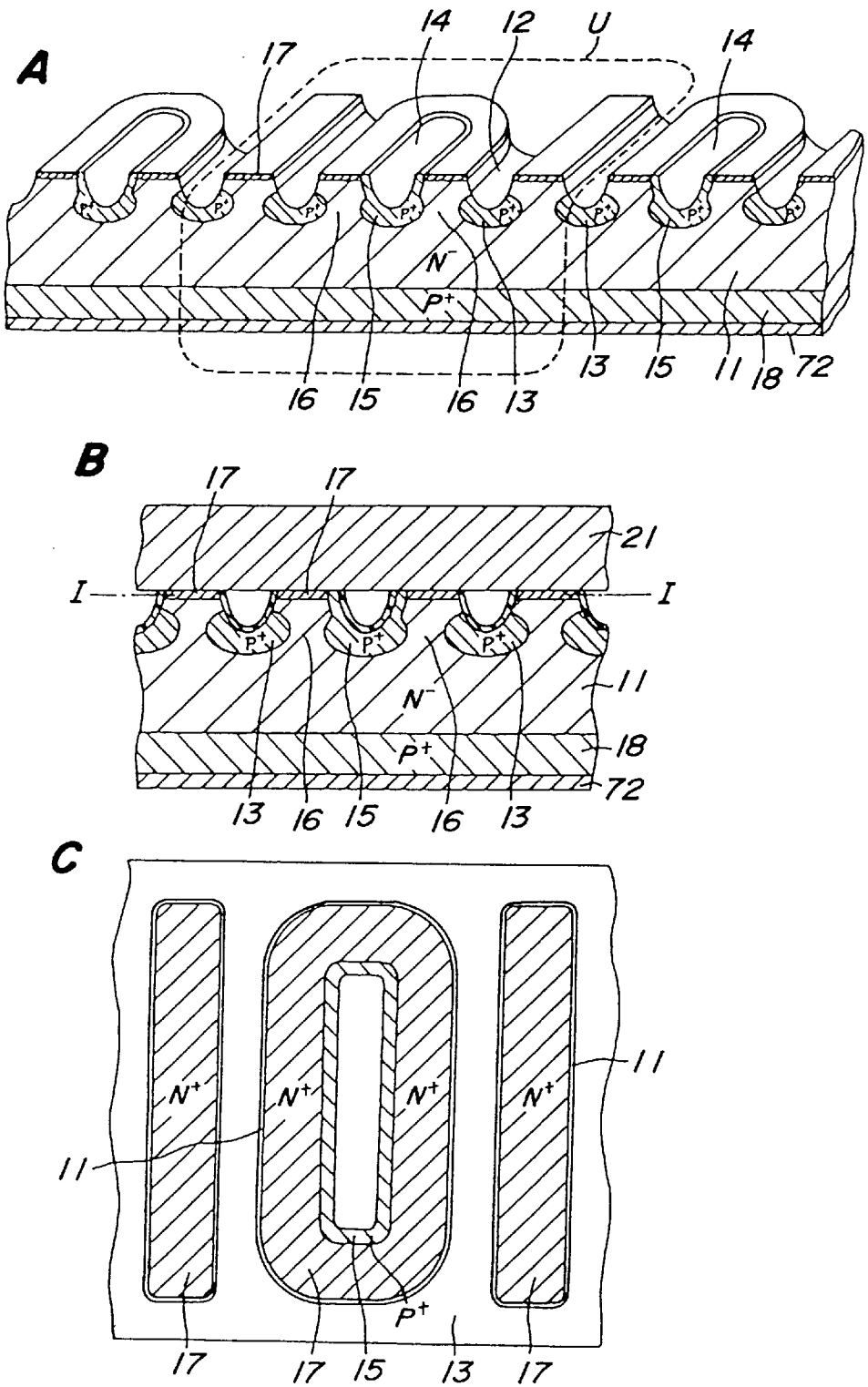
FIGS. 37A, 37B and 37C are a perspective view showing another embodiment of the semiconductor device according to the invention, a longitudinal cross sectional view and a cross sectional view cut along a line I—I in FIG. 37B, respectively.

FIG. 37 shows another embodiment of the semiconductor device according to the invention. FIG. 37A is a perspective view and FIG. 37B is a longitudinal cross sectional view showing the structure of one element unit U, and FIG. 37C is a lateral cross sectional view cut along a line I—I in FIG. 37B. In FIG. 37C, the insulating layers formed on the inner walls of the recessed portions are omitted. Also in this embodiment, portions similar to those of the first embodiment shown in FIGS. 1–4 are denoted by the same reference numerals used in the first embodiment.

In a bipolar type static induction transistor, a switching element of low on-voltage not higher than 1 Volt can be obtained which could never be realized by a conventional type static induction thyristor by applying a forward bias to the PN junction between gate and emitter to inject holes from a P base region into a N⁻ collector region. The present invention may be applied to such a bipolar type static induction transistor. That is to say, by changing the P⁺ anode region 18 of the above embodiment into an N⁺ region of the static induction transistor, holes injected from the P-type base region into the N⁻ collector region can be swept through the cathode short-circuit region into the cathode electrode at a high speed during turn-off operation. In this manner, it is possible to realize a high qualified static induction transistor having a higher speed than the conventional bipolar type static induction transistor and a low on-resistance which could not attained by the conventional thyristor.

Figure 38:
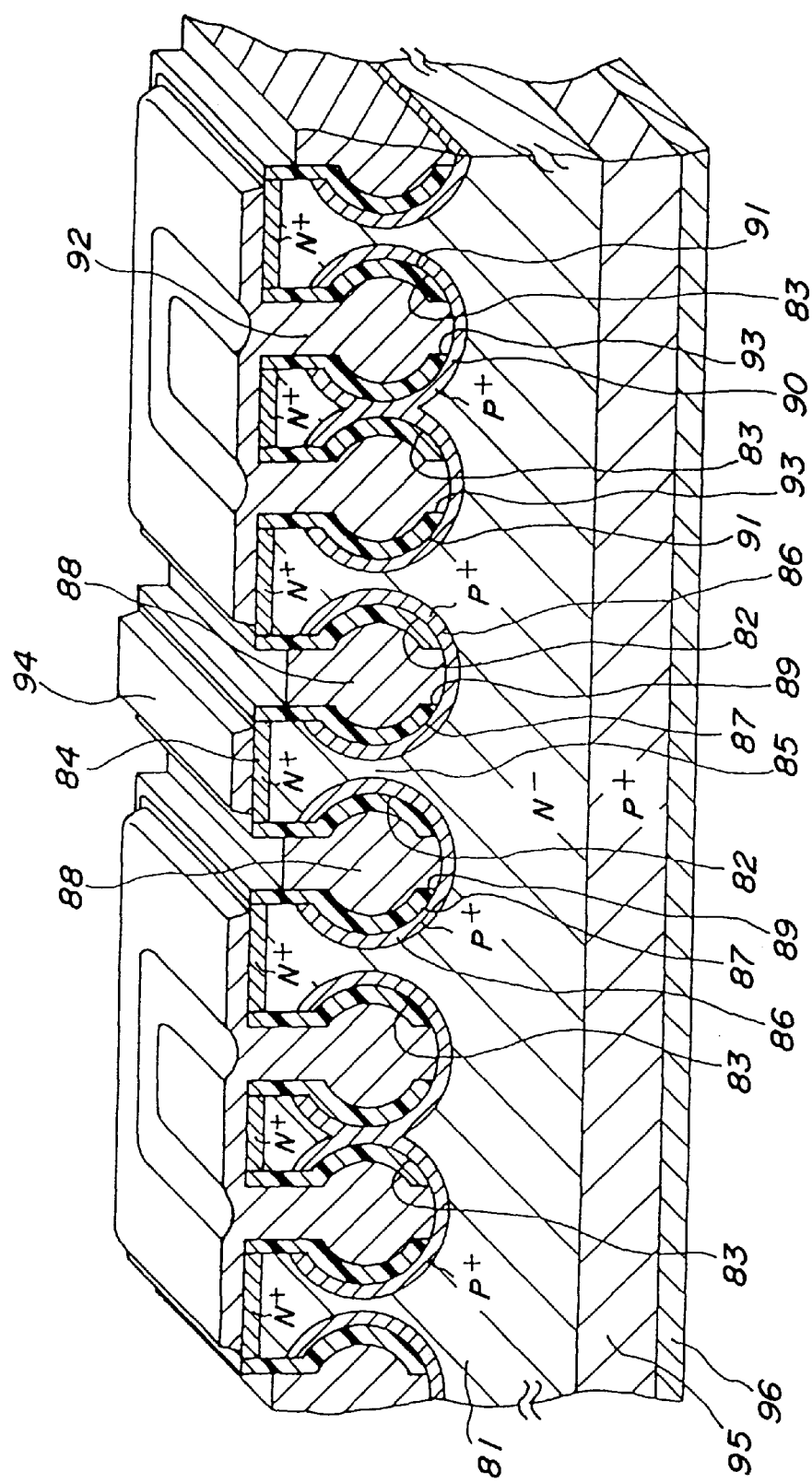
FIG. 38 is a perspective view showing the structure of still another embodiment of the semiconductor device according to the invention.

FIG. 38 shows a main part of structure of another embodiment of the semiconductor device according to the invention. In this embodiment, a semiconductor device is formed as an static induction thyristor. First and second groups of recessed portions 82 and 83 are formed in a surface of an N⁻ silicon substrate 81. In this embodiment, each of the first and second groups contains two recessed portions.

Mesa-type regions are formed between adjacent recessed portions 82 of the first group and N⁺ cathode regions 84 of a high impurity concentration are formed on the surfaces of the mesa-type regions, and channel regions 85 are formed under the mesa-type regions, said channel regions being formed by a bulk of the silicon substrate 81. Each of the first and second group recessed portions 82 and 83 are formed by first forming a recessed portion having substantially upright wall by the anisotropic etching, and then by forming a recessed portion having a curved wall by the isotropic etching. Therefore, it is possible to form the recessed portions having a high aspect ratio and having an overhang portion.

P⁺ gate regions 86 are formed by injecting P-type impurities from the inner walls of the first group recessed portions 82 and first insulating layers 87 are formed on the inner walls of the recessed portions. Moreover, gate electrodes 88 made of a metal are formed on the inner walls of the first group recessed portions 82. The gate electrodes 88 are connected to the gate regions 86 through openings 89 formed in the first insulating layers 87.

P⁺ cathode short-circuit regions 90 are formed along the second group recessed portions 83. The P⁺ cathode short-circuit regions 90 and gate regions 86 can be formed simultaneously. Second insulating layers 91 are formed on the inner walls of the second group recessed portions together with said first insulating layers. Moreover, conducting regions 92 made of a metal are formed in the second group recessed portions 83. The conducting regions 92 are brought into contact with the cathode short-circuit regions 90 through openings 93 formed in the second insulating layers 91. The conducting regions 92 are extended to the surface of the silicon substrate 81 and are connected to a cathode electrode 94. In FIG. 38, a conductive member connecting the conducting regions 92 to the cathode electrode 94 is not shown, but the conductive member may be formed by a metal plate like as the previous embodiment.

A P⁺ anode region 95 is formed by injecting P-type impurities into the rear surface of the silicon substrate 81 and an anode electrode 96 is formed on the anode region to complete the static induction thyristor.

In the embodiment illustrated in FIG. 38, the cathode region 84 and channel region 85 are formed by the mesa-type regions having a high aspect ratio so that the element can be miniaturized. Of course, since the cathode short-circuit region 90 is formed, carriers can be swept out into the cathode region at a high speed upon the turn-off and a switching characteristic can be improved.

Industrial Applicability

Apparent from the above description, in the semiconductor device according to the present invention, the cathode short-circuit region of the same conductivity type as the gate region surrounded by the channel region is provided in the form of an island which is surrounded by the cathode region, and the cathode short-circuit region is brought into contact with the cathode electrode substrate together with the cathode region. Therefore, carriers remaining within the channel region at the turn-off can be directly swept out into the cathode electrode substrate through the cathode short-circuit region, and thus the voltage drop across the cathode and gate can be small and a large current can be effectively cut off. Moreover, residual carriers at the turn-off can be directly swept out into the cathode electrode at high speed, and therefore a switching loss can be small and a maximum switching frequency can be increased.

In the embodiments in which both the cathode region and the channel region are formed in the mesa-type region, the element can be miniaturized.

I claim:

1. A semiconductor device characterized in that it comprises a semiconductor substrate of one conductivity type having first recessed portions formed in one surface thereof, gate regions of the other conductivity type formed along the first recessed portions, cathode regions of the one conductivity type formed on the surface of the semiconductor substrate surrounded by the gate regions, cathode short-circuit regions of the other conductivity type surrounded by the cathode regions and channel regions formed by the semiconductor substrate of the one conductivity type, and a cathode electrode substrate made of a metal or semiconductor and being brought into contact with the surfaces of the cathode regions and cathode short-circuit regions.

2. A semiconductor device as claimed in claim 1, wherein second recessed portions are formed in said cathode short-circuit regions.

3. A semiconductor device as claimed in claim 2, wherein the cathode short-circuit region is formed by a plurality of projected portions of the other conductivity type formed in the one surface of the semiconductor substrate of the one conductivity type, said second recessed portions are formed such that each of the second recessed portions surround respective projected portions of the other conductivity type, and said cathode region of the one conductivity type is formed in a projected portion which is surrounded by said second recessed portion and the first recessed portion defining said gate region.

4. A semiconductor device as claimed in claim 1, wherein said cathode region is formed as an island which is surrounded by said second recessed portion.

5. A semiconductor device as claimed in any of claim 1, wherein said channel region surrounded by the gate region is arranged in parallel with the cathode short-circuit region.

6. A semiconductor device as claimed in any of claim 1, wherein said gate region of the other conductivity type formed along the surface of the first and/or second recessed portion formed in the semiconductor substrate of the one conductivity type is covered with an insulating layer.

7. A semiconductor device as claimed in claim 6, wherein an electrode made of a metal or semiconductor is formed to be contacted to with the gate region and/or cathode short-circuit region through an opening formed in said insulating layer.

8. A semiconductor device as claimed in any of claim 1, wherein the semiconductor substrate of the one conductivity type is made of silicon, and an Au—Sb, Al—Si or Al—Sb alloy layer or Al layer is formed on the surface of the cathode electrode substrate which is brought into contact with the cathode region and cathode short-circuit region.

9. A semiconductor device as claimed in any of claim 1, wherein a high impurity concentration regions of the one conductivity type is formed on the cathode region to be contacted with the cathode electrode substrate.

10. A semiconductor device as claimed in any of claim 1, wherein the cathode electrode substrate is formed by a metal plate, and a metal layer is formed on the surface of the cathode region which is contacted with the metal plate.

11. A semiconductor device as claimed in any of claim 1, wherein one or more channel regions surrounded by the gate region are formed to be contacted with an outer gate region in a unit composed of adjacent segments consisting of the cathode regions surrounding the cathode short-circuit region through an opening formed in an insulating layer.

12. A semiconductor device as claimed in any of claim 1, wherein a plurality of segments each consisting of the cathode region surrounding the cathode short-circuit region are arranged in parallel with each other, and one or more channel regions surrounded by the gate region are formed between cathode region surrounding adjacent cathode short-circuit regions.

13. A semiconductor device as claimed in any of claim 1, wherein an anode region of the other conductivity type is formed on the other surface of the semiconductor substrate.

14. A semiconductor device as claimed in any of claim 1, wherein a high impurity concentration region of the one conductivity type is formed on the other surface of the semiconductor substrate.

15. A semiconductor device characterized in that it comprises a semiconductor substrate of one conductivity type, first and second group recessed portions formed in one surface of the semiconductor substrate, each having an overhang portion, cathode regions of the one conductivity type, each being formed in a surface of a mesa-type region having a high aspect ratio formed by adjacent first group recessed portions, cathode electrodes formed to be contacted with the cathode regions, channel regions of the one conductivity type formed in the mesa-type regions to have a smaller cross sectional area than of the cathode region, gate regions of the other conductivity type formed along the first recessed portions, first insulating layers formed on inner walls of the first recessed portions, gate electrodes formed to be contacted with the gate regions through openings formed in the first insulated layer, cathode short-circuit regions of the other conductivity type formed along the second recessed portions, second insulating layers formed on inner walls of the second recessed portions, conductive regions formed to be contacted with the cathode short-circuit regions through openings formed in the second insulating layers and to be contacted with the cathode electrodes, an anode of the other conductivity type formed on the other surface of the silicon substrate, and an anode electrode formed to be contacted with the anode region.

16. A semiconductor device as claimed in claim 15, wherein each of the recessed portions having the overhang portions has a cross sectional configuration formed by anisotropic etching and a succeeding cross sectional configuration formed by isotropic etching.

17. A semiconductor device as claimed in claim 15, wherein the cathode electrode is formed by a conductive material plate which is joined with the cathode regions and conducting regions.

* * * * *